United States Patent
Jones et al.

(10) Patent No.: US 9,214,614 B2
(45) Date of Patent: ***Dec. 15, 2015

(54) FLEXIBLE LIGHTING DEVICE HAVING UNOBTRUSIVE CONDUCTIVE LAYERS

(71) Applicant: Grote Industries, LLC, Madison, IN (US)

(72) Inventors: Scott J. Jones, Romeo, MI (US); Martin J. Marx, Madison, IN (US); Stanley D. Robbins, Deputy, IN (US); James E. Roberts, Madison, IN (US)

(73) Assignee: Grote Industries, LLC, Madison, IN (US)

( * ) Notice: Subject to any disclaimer, the term of this patent is extended or adjusted under 35 U.S.C. 154(b) by 51 days.

This patent is subject to a terminal disclaimer.

(21) Appl. No.: 13/948,472

(22) Filed: Jul. 23, 2013

(65) Prior Publication Data
US 2015/0028377 A1    Jan. 29, 2015

(51) Int. Cl.
*H01L 33/62* (2010.01)
*H01L 25/075* (2006.01)

(52) U.S. Cl.
CPC ............ *H01L 33/62* (2013.01); *H01L 25/0753* (2013.01); *H01L 2224/13* (2013.01)

(58) Field of Classification Search
None
See application file for complete search history.

(56) References Cited

U.S. PATENT DOCUMENTS

| | | |
|---|---|---|
| 8,482,212 B1 | 7/2013 | Ivey et al. |
| 2002/0060526 A1 | 5/2002 | Timmermans et al. |
| 2007/0105250 A1* | 5/2007 | Daniels et al. ................. 438/22 |
| 2009/0061233 A1* | 3/2009 | Yaegashi .................... 428/411.1 |
| 2009/0114928 A1* | 5/2009 | Messere et al. ................ 257/88 |
| 2010/0317132 A1 | 12/2010 | Rogers et al. |
| 2011/0195532 A1 | 8/2011 | Lerman et al. |
| 2011/0315956 A1 | 12/2011 | Tischler et al. |
| 2012/0038047 A1 | 2/2012 | Do et al. |
| 2012/0193648 A1 | 8/2012 | Donofrio et al. |

OTHER PUBLICATIONS

Extended European Search Report issued by the European Patent Office on Jan. 8, 2015 in corresponding European Patent Application No. 14178056.9.

* cited by examiner

*Primary Examiner* — Khaja Ahmad
(74) *Attorney, Agent, or Firm* — Posz Law Group, PLC

(57) ABSTRACT

A lighting element is provided, comprising: a substrate; a first conductive element on the substrate; a light-emitting element having first and second contacts on top and bottom surfaces, respectively; a transparent layer adjacent to the top surface; an affixing layer between the substrate and the transparent layer, affixing the transparent layer to the substrate; and a second conductive element beneath the transparent layer and proximate to the top surface, wherein the first and second contacts are electrically connected to the first and second conductive elements, respectively, the light-emitting element emits light in a range of wavelengths between 10 nm and 100,000 nm, the transparent and affixing layer's will not decrease light transmittance below 70%, and the first and second conductive elements are at least partially transparent to visible light, or are 300 μm or smaller in width, or are concealed by a design feature from a viewing direction.

33 Claims, 16 Drawing Sheets

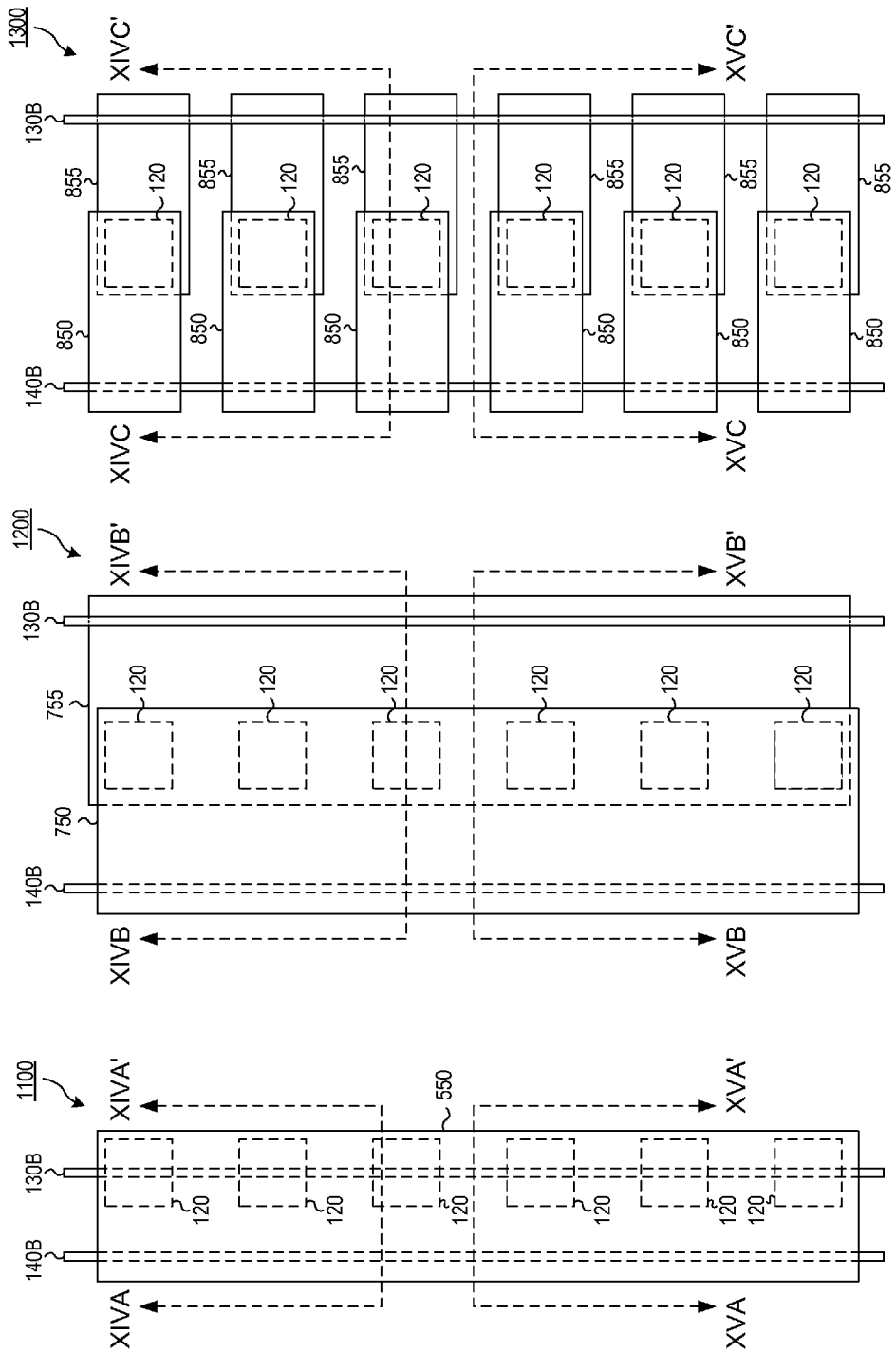

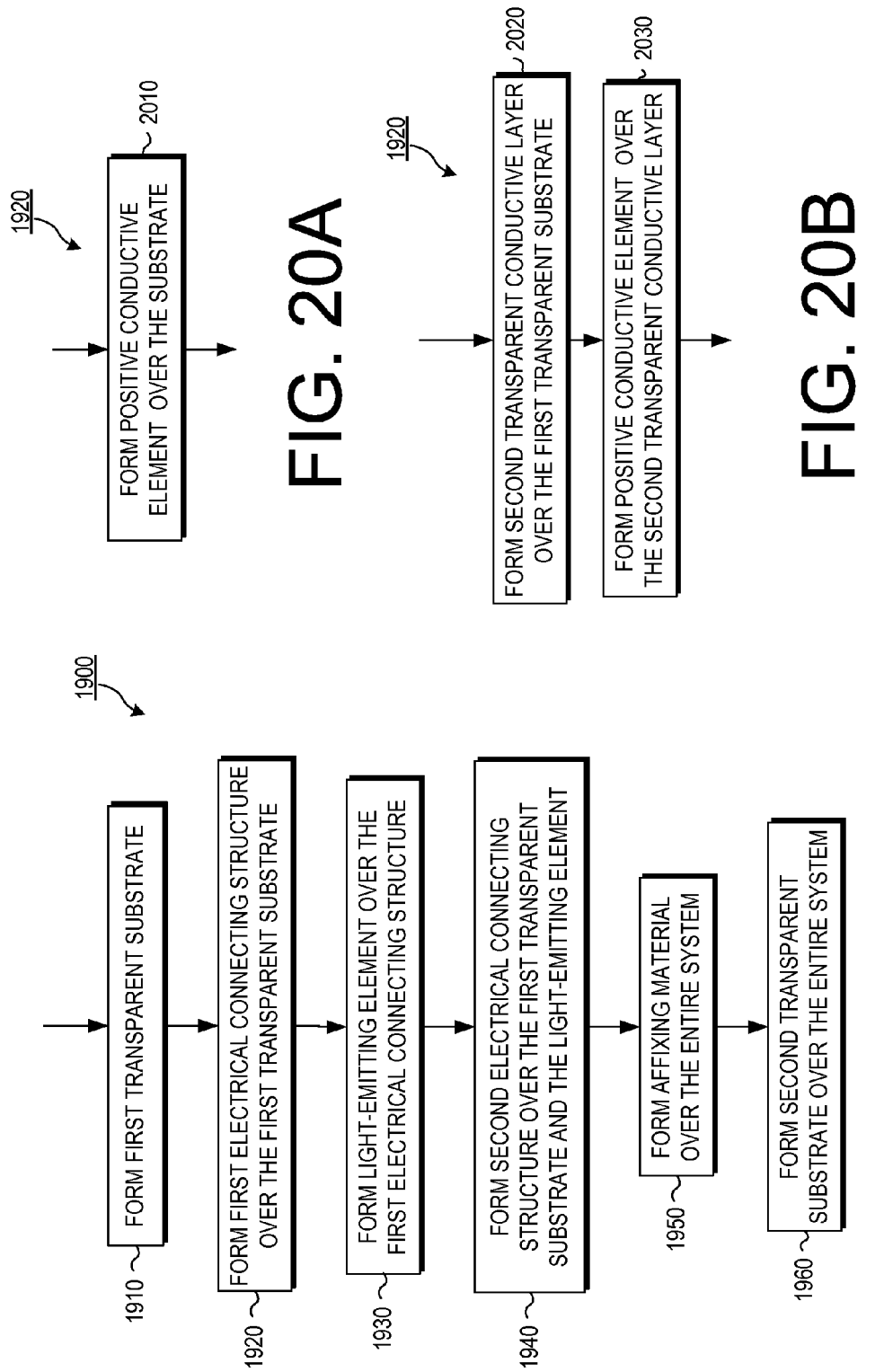

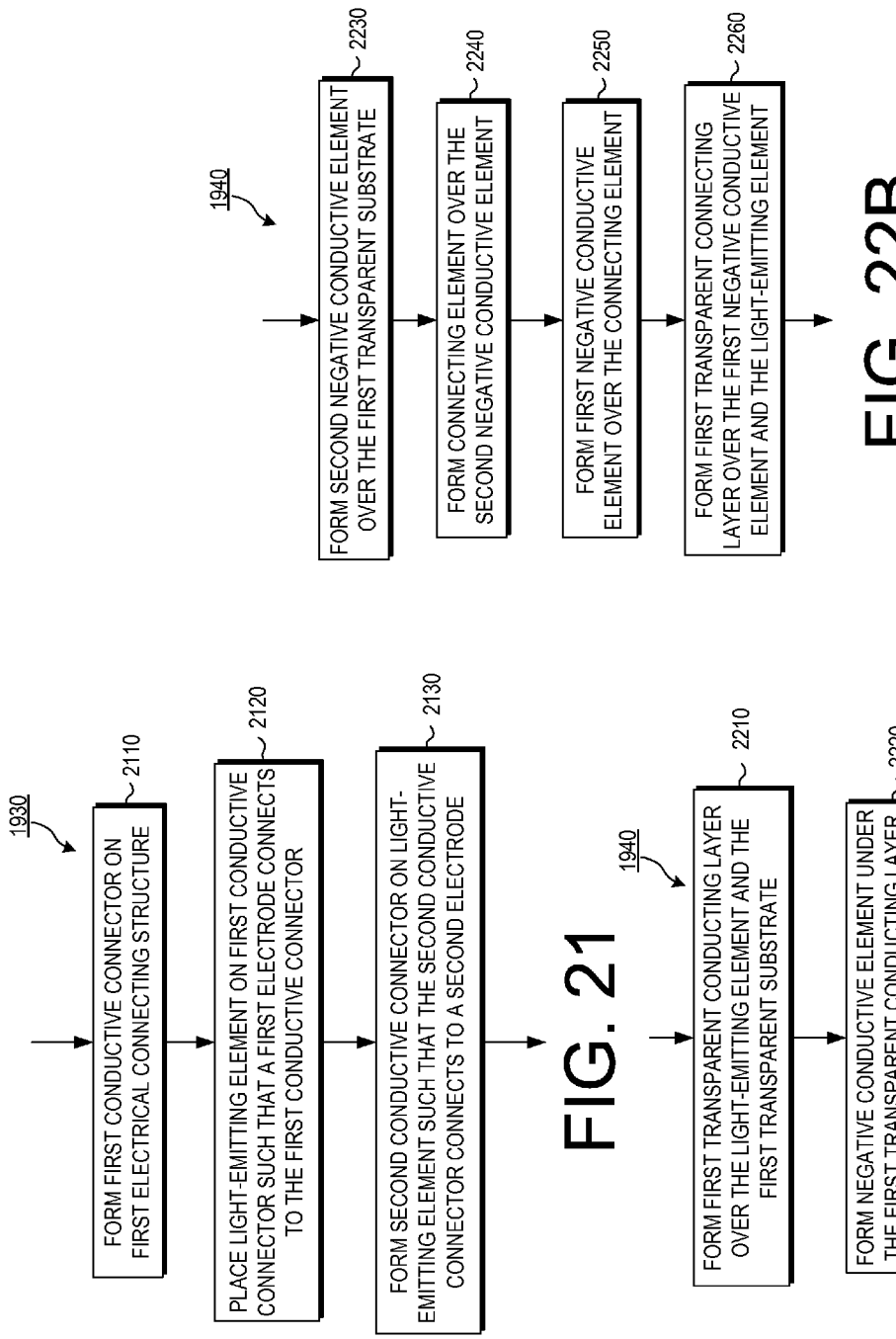

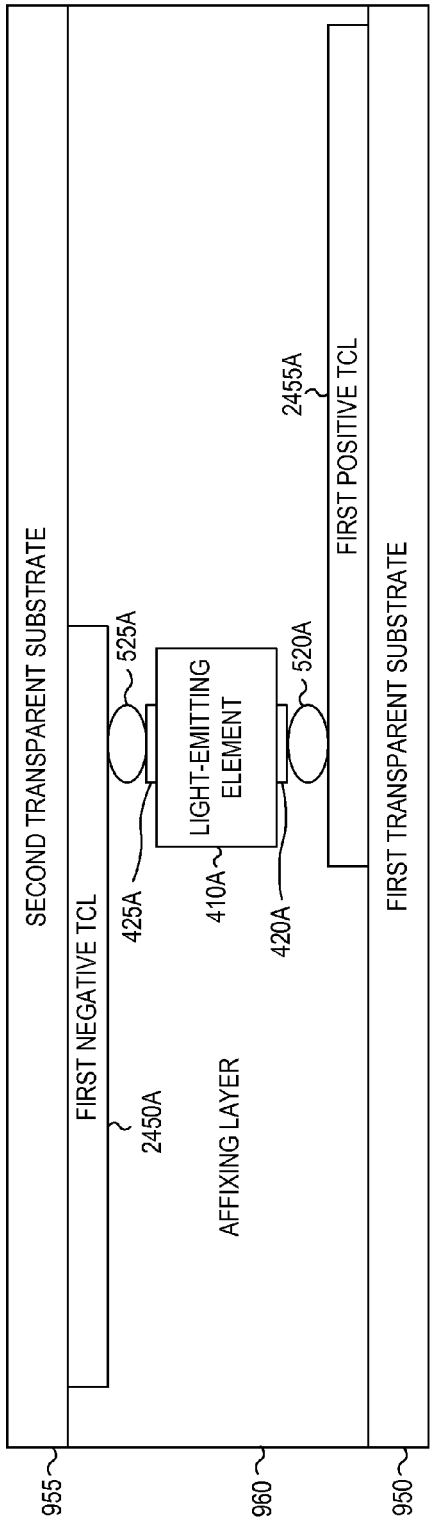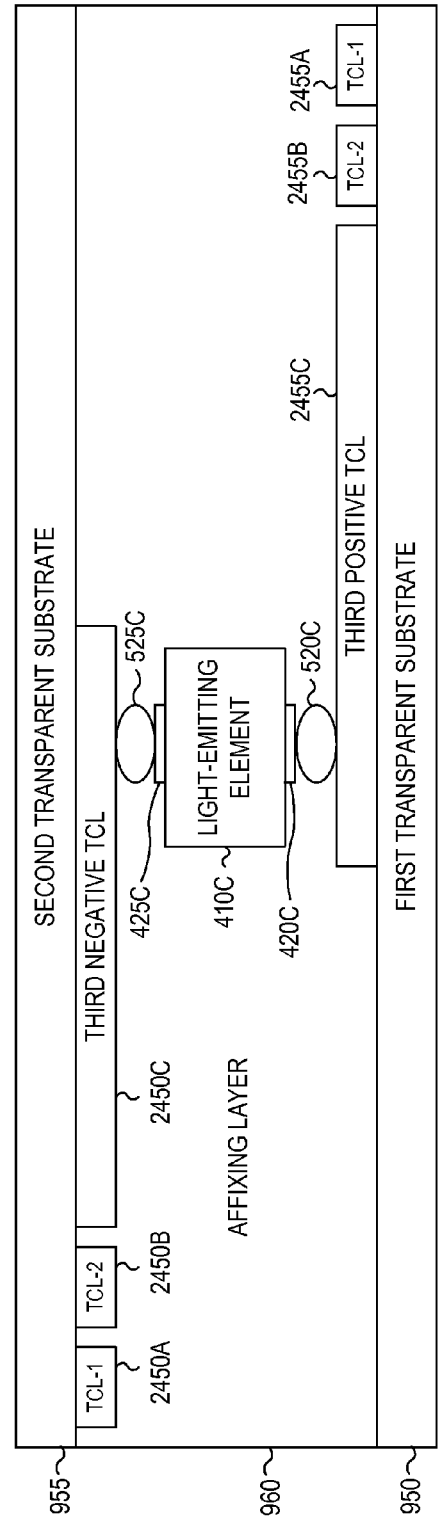

FLEXIBLE LIGHTING DEVICE HAVING UNOBTRUSIVE CONDUCTIVE LAYERS

FIELD OF THE INVENTION

The present invention relates generally to a device that contains a number of controllable lighting elements on it. More particularly, the present invention relates to a flexible device containing a number of light-emitting diodes that can be controlled to light up, such that only the light-emitting diodes can be easily seen.

BACKGROUND OF THE INVENTION

Light-emitting diodes (LEDs) can be used to provide low-cost, low-power lighting in a variety of situations, including home, automotive, and commercial. However, in order for the LEDs to be properly controlled, there must be conductive lines that run from a controller to each of the LEDs. The requirement to have these conductive lines to control the operation of the LEDs means that in conventional lighting devices, a pair of lines can be seen that connect to each LED in the lighting device.

As a result of this, there is a limit on the attractiveness of conventional lighting devices. For aesthetic reasons, many designers and consumers would like the LEDs alone to be visible in a lighting element, making them appear as if they were lights standing alone, without any support.

In addition, many lighting devices are rigid devices, which limit their use in many situations by fixing their size and shape.

It would therefore be desirable to provide a low-power, flexible lighting device that includes one or more relatively large lighting elements, but that can be easily manufactured in which all elements of the lighting device, aside from the lighting elements, were either transparent or at least very difficult to see with the naked eye.

SUMMARY OF THE INVENTION

A lighting element, is provided, comprising: a first substrate; a first conductive element located on the first substrate; a light-emitting element having a first contact and a second contact, the first contact being on a first surface of the light-emitting element, the second contact being on a second surface of the light-emitting element that is opposite to the first side; a transparent layer located adjacent to the second surface of the light-emitting element; a transparent affixing layer located between the first substrate and the transparent layer, the affixing layer being configured to affix the transparent layer to the first substrate; and a second conductive element located beneath the transparent layer and proximate to the second surface of the light-emitting element, wherein the first contact is electrically connected to the first conductive element, the second contact is electrically connected to the second conductive element, the light-emitting element is configured to emit light from the second surface with the light having wavelengths between 10 nm and 100,000 nm, the transparent layer and the transparent affixing layer are both sufficiently transparent to visible light such that they will not decrease light transmittance below 70%, and the first and second conductive elements are at least partially transparent to visible light.

The lighting element may further comprise: a second transparent conductive layer formed at least partially adjacent to the second contact and at least partially adjacent to the second conductive element, the second transparent conductive layer configured to electrically connect the second contact and the second conductive element, wherein the second transparent conductive layer is sufficiently transparent to visible light such that they will not decrease light transmittance below 70%.

The lighting element may further comprise: a first transparent conductive layer formed at least partially adjacent to the first contact and at least partially adjacent to the first conductive element, the first transparent conductive layer configured to electrically connect the first contact and the first conductive element, wherein the first transparent conductive layer is sufficiently transparent to visible light such that they will not decrease light transmittance below 70%.

The light-emitting element may be formed to be at least partially over the first conductive element. In some embodiments, no part of the light-emitting element is formed over the first conductive element.

The lighting element may further comprise: a third conductive element located on the first flexible substrate; a connection element located between the second conductive element and the third conductive element, the connection element being configured to electrically connect the second conductive element to the third conductive element, wherein the third conductive element is at least partially transparent to the selected wavelength of light.

The connection element may be at least partially transparent to the selected wavelength of light. The flexible layer may be one of a second flexible substrate and a hardened conformal coating. The first flexible substrate may be substantially transparent to the selected wavelength of light. The first and second conductive elements may each comprise copper, copper alloy silver, silver alloy aluminum, or aluminum alloy. The first and second conductive elements may both be buss bars.

A method of forming a lighting element is provided, comprising: forming a first substrate; forming a first conductive element on the first substrate; installing a light-emitting element over the first substrate such that a first contact of the light-emitting element is electrically connected to the first conductive element, the first contact being on a first surface of the light-emitting element; forming a second conductive element proximate to a second surface of the light-emitting element such that a second contact of the light-emitting element, formed on the second surface, is electrically connected to the second conductive element, the second surface being opposite the first surface; forming a transparent affixing layer over the first substrate; and forming a transparent layer over the light-emitting element and the transparent affixing layer such that the transparent affixing layer affixes the transparent layer to the first substrate, wherein the transparent layer and the transparent affixing layer are both sufficiently transparent to visible light such that they will not decrease light transmittance below 70%, the light-emitting element is configured to emit light from the second surface with the light in a selected set of wavelengths between 10 nm and 100,000 nm, the first and second conductive layers are at least partially transparent to visible light.

The method may further comprise: forming a second transparent conductive layer at least partially adjacent to the second contact, wherein in the operation of applying the second conductive element, the second conductive element is applied to be at least partially adjacent to the second transparent contact layer, the second transparent conductive layer is configured to electrically connect the second contact and the second conductive element, the second transparent conductive layer is substantially transparent to the selected wavelength of light.

The method may further comprise: applying a first transparent conductive layer at least partially adjacent to the first conductive element, wherein in the operation of installing the light-emitting element, the first contact is applied to be at least partially adjacent to the first transparent conductive layer, the first transparent conductive layer is configured to electrically connect the first contact and the first conductive element, the first transparent conductive layer is substantially transparent to the selected wavelength of light.

The light-emitting element is formed to be at least partially over the first conductive element. In some embodiments, no part of the light-emitting element is applied over the first conductive element.

The method may further comprise: applying a third conductive element over the first flexible substrate; and applying a connection element over the third conductive element, wherein in the operation of installing the second conducting element, the first contact is applied to be at least partially adjacent to the first transparent conductive layer, the second conductive element is substantially horizontally aligned over the third conductive element, such that the connection element electrically connects the third conductive element to the second conductive element, the first transparent conductive layer and the transparent affixing layer are both sufficiently transparent to visible light such that they will not decrease light transmittance below 70%, and the third conductive element is at least partially transparent to the selected wavelength of light.

The connection element may be at least partially transparent to the selected wavelength of light. The connection element may comprise copper, copper alloy, silver, silver alloy, aluminum, or aluminum alloy. The transparent layer may be one of a second substrate and a hardened conformal coating. The first and second conductive elements may each comprise copper, copper alloy, silver, silver alloy, aluminum, or aluminum alloy, other conductive metals, conductive epoxy, or conductive inks, conductive graphite or a carbon-based conductive material. The first substrate may be sufficiently transparent to visible light such that it will not decrease light transmittance below 70%. The first and second conductive elements may both be buss bars.

A lighting element is provided, comprising: a first substrate; a first conductive element located on the first substrate; a light-emitting element having a first contact and a second contact, the first contact being on a first surface of the light-emitting diode, the second contact being on a second surface of the light-emitting element that is opposite to the first side; a transparent layer located adjacent to the second surface of the light-emitting element; a transparent affixing layer located between the first substrate and the transparent layer, the transparent affixing layer being configured to affix the transparent layer to the first substrate; and a second conductive element located beneath the transparent layer and proximate to the second surface of the light-emitting element, wherein the first contact is electrically connected to the first conductive element, the second contact is electrically connected to the second conductive element, the light-emitting element is configured to emit light from the second surface with the light in wavelengths between 10 nm and 100,000 nm, the transparent layer and the transparent affixing layer are both sufficiently transparent to visible light such that they will not decrease light transmittance below 70%, and the first and second conductive layers are 300 μm or smaller in width.

The lighting element may further comprise: a second transparent conductive layer formed at least partially adjacent to the second contact and at least partially adjacent to the second conductive element, the second transparent conductive layer configured to electrically connect the second contact and the second conductive element, wherein the second transparent conductive layer is sufficiently transparent to visible light such that they will not decrease light transmittance below 70%.

The lighting element may further comprise: a first transparent conductive layer formed at least partially adjacent to the first contact and at least partially adjacent to the first conductive element, the first transparent conductive layer configured to electrically connect the first contact and the first conductive element, wherein the first transparent conductive layer is sufficiently transparent to visible light such that they will not decrease light transmittance below 70%.

The light-emitting element may be applied to be at least partially over the first conductive element. In some embodiments, no part of the light-emitting element is applied over the first conductive element.

The lighting element may further comprise: a third conductive element located on the first substrate; a connection element located between the second conductive element and the third conductive element, the connection element being configured to electrically connect the second conductive element to the third conductive element, wherein the third conductive element is at least partially transparent to the selected wavelengths between 10 nm and 100,000 nm.

The connection element may be at least partially transparent to the wavelength of light between 10 nm and 100,000 nm. The transparent layer may be one of a second substrate and a hardened conformal coating. The first and second conductive elements may each comprise a conductive material. The first and second conductive elements may each comprise copper, copper alloy, silver, silver alloy, aluminum, or aluminum alloy, conductive epoxy, or conductive inks. The first and second conductive elements may both be buss bars.

A method of forming a lighting element is provided, comprising: forming a first substrate; forming a first conductive element on the first substrate; installing a light-emitting element over the first substrate such that a first contact of the light-emitting element is electrically connected to the first conductive element, the first contact being on a first surface of the light-emitting element; applying a second conductive element proximate to a second surface of the light-emitting element such that a second contact of the light-emitting element, applied on the second surface, is electrically connected to the second conductive element, the second surface being opposite the first surface; applying a transparent affixing layer over the first substrate; and applying a transparent layer over the light-emitting element and the transparent affixing layer such that the transparent affixing layer affixes the transparent layer to the first substrate, wherein the transparent layer and the transparent affixing layer are both sufficiently transparent to visible light such that they will not decrease light transmittance below 70%, the light-emitting element is configured to emit light from the second surface with the light in wavelengths between 10 nm and 100,000 nm, the first and second conductive layers are 300 μm or smaller in width.

The method may further comprise: applying a second transparent conductive layer at least partially adjacent to the second contact, wherein in the operation of applying the second conductive element, the second conductive element is applied to be at least partially adjacent to the second transparent contact layer, the second transparent conductive layer is configured to electrically connect the second contact and the second conductive element, the second transparent conductive layer is sufficiently transparent to visible light such that they will not decrease light transmittance below 70%.

The method may further comprise: applying a first transparent conductive layer at least partially adjacent to the first conductive element, wherein in the operation of installing the light-emitting element, the first contact is applied to be at least partially adjacent to the first transparent conductive layer, the first transparent conductive layer is configured to electrically connect the first contact and the first conductive element, the first transparent conductive layer is sufficiently transparent to visible light such that they will not decrease light transmittance below 70%.

The light-emitting element may be applied to be at least partially over the first conductive element. In some embodiments, no part of the light-emitting element is applied over the first conductive element.

The method may further comprise: applying a third conductive element over the first substrate; and applying a connection element over the third conductive element, wherein in the operation of installing the second conducting element, the first contact is applied to be at least partially adjacent to the first transparent conductive layer, the second conductive element is substantially horizontally aligned over the third conductive element, such that the connection element electrically connects the third conductive element to the second conductive element, the first transparent conductive layer is sufficiently transparent to visible light such that they will not decrease light transmittance below 70%, and the third conductive element is at least partially transparent to wavelengths between 10 nm and 100,000 nm.

The connection element may be at least partially transparent to the selected wavelength of light. The connection element may comprise copper, copper alloy, silver, silver alloy, aluminum, or aluminum alloy. The transparent layer may be one of a second substrate and a hardened conformal coating. The first and second conductive elements may each comprise copper, copper alloy, silver, silver alloy, aluminum, or aluminum alloy. The first flexible substrate may be sufficiently transparent to visible light such that they will not decrease light transmittance below 70%. The first and second conductive elements may both be buss bars.

A lighting element is provided, comprising: a first substrate; a first conductive element located on the first substrate; a light-emitting element having a first contact and a second contact, the first contact being on a first surface of the light-emitting diode, the second contact being on a second surface of the light-emitting element that is opposite to the first side; a transparent layer located adjacent to the second surface of the light-emitting element; a transparent affixing layer located between the first substrate and the transparent layer, the transparent affixing layer being configured to affix the transparent layer to the first substrate; a second conductive element located beneath the transparent layer and proximate to the second surface of the light-emitting element; and an opaque design feature formed over at least one of the first conductive element and the second conductive element, the opaque design concealing at least one of the first conductive element and the second conductive element from above, wherein the first contact is electrically connected to the first conductive element, the second contact is electrically connected to the second conductive element, the light-emitting element is configured to emit light from the second surface with the light having wavelengths between 10 nm and 100,000 nm, and the transparent layer and the transparent affixing layer are both sufficiently transparent to visible light such that they will not decrease light transmittance below 70%.

The lighting element may further comprise: a second transparent conductive layer applied at least partially adjacent to the second contact and at least partially adjacent to the second conductive element, the second transparent conductive layer configured to electrically connect the second contact and the second conductive element, wherein the second transparent conductive layer is sufficiently transparent to visible light such that they will not decrease light transmittance below 70%.

The lighting element may further comprise: a first transparent conductive layer formed at least partially adjacent to the first contact and at least partially adjacent to the first conductive element, the first transparent conductive layer configured to electrically connect the first contact and the first conductive element, wherein the first transparent conductive layer is sufficiently transparent to visible light such that they will not decrease light transmittance below 70%.

The light-emitting element may be formed to be at least partially over the first conductive element. In some embodiments, no part of the light-emitting element is formed over the first conductive element.

The lighting element may further comprise: a third conductive element located on the first substrate; a connection element located between the second conductive element and the third conductive element, the connection element being configured to electrically connect the second conductive element to the third conductive element, wherein the third conductive element is at least partially transparent to wavelengths between 10 nm and 100,000 nm.

The connection element may be at least partially transparent to wavelengths between 10 nm and 100,000 nm. The transparent layer may be one of a second substrate and a hardened conformal coating.

The opaque design feature may comprise: a first opaque design feature formed over the first conductive element, the first opaque design completely concealing the first conductive element from above; and a second opaque design feature formed over the second conductive element, the second opaque design completely concealing the second conductive element from above.

The first and second conductive elements may both be buss bars. The opaque design feature may be an ornamental decoration, a frame, a filter, or a mask.

A method of forming a lighting element is provided, comprising: forming a first substrate; forming a first conductive element on the first substrate; installing a light-emitting element over the first substrate such that a first contact of the light-emitting element is electrically connected to the first conductive element, the first contact being on a first surface of the light-emitting element; forming a second conductive element proximate to a second surface of the light-emitting element such that a second contact of the light-emitting element, formed on the second surface, is electrically connected to the second conductive element, the second surface being opposite the first surface; forming a transparent affixing layer over the first flexible substrate; forming a transparent layer over the light-emitting element and the transparent affixing layer such that the transparent affixing layer affixes the transparent layer to the first substrate; and forming an opaque design feature over at least one of the first conductive element and the second conductive element, the opaque design at least partially concealing at least one of the first conductive element and the second conductive element from above, wherein the flexible layer and the affixing layer are both sufficiently transparent to visible light such that they will not decrease light transmittance below 70%, the light-emitting element is configured to emit light from the second surface with the light in wavelengths between 10 nm and 100,000 nm, and the first and second conductive layers are at least partially transparent to visible light.

The method may further comprise: applying a second transparent conductive layer at least partially adjacent to the second contact, wherein in the operation of applying the second conductive element, the second conductive element is applied to be at least partially adjacent to the second transparent contact layer, the second transparent conductive layer is configured to electrically connect the second contact and the second conductive element, the second transparent conductive layer is sufficiently transparent to visible light such that they will not decrease light transmittance below 70%.

The method may further comprise: applying a first transparent conductive layer at least partially adjacent to the first conductive element, wherein in the operation of installing the light-emitting element, the first contact is applied to be at least partially adjacent to the first transparent conductive layer, the first transparent conductive layer is configured to electrically connect the first contact and the first conductive element, the first transparent conductive layer is sufficiently transparent to visible light such that they will not decrease light transmittance below 70%.

The light-emitting element may be applied to be at least partially over the first conductive element. In some embodiments, no part of the light-emitting element is applied over the first conductive element.

The method may further comprise: applying a third conductive element over the first flexible substrate; and applying a connection element over the third conductive element, wherein in the operation of installing the second conducting element, the first contact is applied to be at least partially adjacent to the first transparent conductive layer, the second conductive element is substantially horizontally aligned over the third conductive element, such that the connection element electrically connects the third conductive element to the second conductive element, the first transparent conductive layer is sufficiently transparent to visible light such that they will not decrease light transmittance below 70%, and the third conductive element is at least partially transparent to the selected wavelength of light.

The connection element may be at least partially transparent to the selected wavelength of light. The connection element may comprise copper, copper alloy, silver, silver alloy, aluminum, or aluminum alloy. The transparent layer may be one of a second substrate and a hardened conformal coating.

The operation of forming an opaque design feature may comprise: applying a first opaque design feature over the first conductive element, the first opaque design at least partially concealing the first conductive element from above; and applying a second opaque design feature over the second conductive element, the second opaque design at least partially concealing the second conductive element from above.

The first and second conductive elements may both be buss bars. The opaque design feature may be an ornamental decoration, a frame, a filter, or a mask.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention. These drawings are not necessarily drawn to scale.

FIG. 11 is an overhead view of a portion of a lighting device having thin wire conductive elements according to a disclosed embodiment;

FIG. 12 is an overhead view of a portion of a lighting device having thin wire conductive elements according to another disclosed embodiment;

FIG. 13 is an overhead view of a portion of a lighting device having thin wire conductive elements according to yet another disclosed embodiment;

FIG. 19 is a flow chart showing a manufacturing process of a lighting device according to disclosed embodiments;

FIGS. 20A and 20B are flow charts showing a process of forming a first electrical connecting structure over a first transparent substrate from FIG. 19 according to disclosed embodiments;

FIG. 21 is a flow chart showing a process of forming a light-emitting element over first and second connecting structures from FIG. 19 according to a disclosed embodiment;

FIGS. 22A and 22B are flow charts showing a process of forming a second electrical connecting structure over a first transparent substrate and a light-emitting element from FIG. 19 according to disclosed embodiments;

FIG. 25A is a side cross-sectional view of the flexible lighting device of FIG. 24 along the line XXVA-XXVA' according to a disclosed embodiment;

FIG. 25B is a side cross-sectional view of the flexible lighting device of FIG. 24 along the line XXVB-XXVB' according to a disclosed embodiment.

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Furthermore, elements having the same number represent the same element across the various figures, and throughout the disclosure. Their description is not always repeated for each embodiment, but may be inferred from previous descriptions. Elements that have the same number but have the addition of a letter designator indicate distinct embodiments of a more generic element.

Flexible Lighting Device Structure

Figure 1:
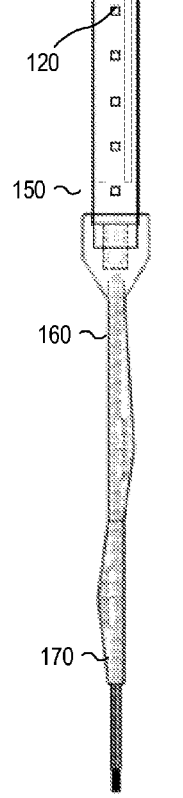
FIG. 1 is an overhead view of a flexible lighting device according to disclosed embodiments.

FIG. 1 is an overhead view of a flexible lighting device 100 according to a disclosed embodiment. As shown in FIG. 1, the flexible lighting device 100 includes a flexible ribbon 110 containing a plurality of lighting elements 120, a positive conductive element 130, and a negative conductive element 140, a control circuit 150, a cable sheath 160, and a cable 170.

The flexible ribbon 110 serves to give structure and protection to the plurality of lighting elements 120 and the positive and negative conductive elements 130, 140.

The plurality of lighting elements 120 operate to generate light based on currents received from the control circuit 150 through the positive and negative conductive elements 130, 140. In the disclosed embodiments, the lighting elements 120 contain light-emitting elements. In some embodiments these lighting-emitting elements could be light-emitting diodes (LEDs) that emit light of a particular wavelength. In other embodiments the light-emitting elements could be LEDs with phosphorus coatings that serve to scatter single-color light generated by the LEDs to make it white light. In still other embodiments the light-emitting elements could be LEDs that include lenses to focus, diffuse, or color the light.

The positive conductive element 130 serves as a means for connecting one node of each of the plurality of lighting elements 120 to a positive voltage signal from the control circuit 150. Likewise, the negative conductive element 140 serves as a means for connecting another node of each of the plurality of lighting elements 120 to a negative voltage signal from the control circuit 150. In the alternative, the negative conductive element 140 may serve as a means for connecting the other node in each of the plurality of lighting elements 120 to a ground voltage. Where a negative voltage signal is referred to in this disclosure, it can also mean a ground voltage.

In the embodiment disclosed in FIG. 1, the positive and negative conductive elements 130, 140 can be any suitable structure that serves to electrically connect nodes of the plurality of lighting elements 120 to positive and negative voltage signals from the control circuit 150.

In alternate embodiments multiple positive conductive elements 130 and negative conductive element 140 could be provided so that different lighting elements 120 could be connected to different positive and negative conductive element 130, 140, thus allowing greater control of the operation of individual lighting elements 120.

Furthermore, although the positive and negative conductive elements 130, 140 are shown in a particular position in FIG. 1, in alternate embodiments they can be placed at various positions on the lighting device.

The control circuit 150 provides positive and negative voltage signals across the positive and negative conductive elements 130, 140, respectively, in order to control the operation of the plurality of lighting elements 120. When the control circuit 150 supplies proper voltages to the positive and negative conductive elements 130, 140, the plurality of lighting elements 120 will turn on and emit light. When the control circuit 150 stops providing the proper voltages to the positive and negative conductive elements 130, 140, the plurality of lighting elements 120 will turn off and cease emitting light.

The cable sheath 160 serves to protect the cable 170 from damage, while the cable 170 provides power and control signals to the control circuit 150.

In operation, the control circuit 150 will either have a set pattern for operating the plurality of lighting elements 120, or will receive lighting control signals from an external source indicating how it should operate the plurality of lighting elements 120. Based on the set pattern or the lighting control signals, the control circuit 150 will provide appropriate voltages to the positive and negative conductive elements 130, 140 to activate the plurality of lighting elements 120 at desired times.

Figure 2:
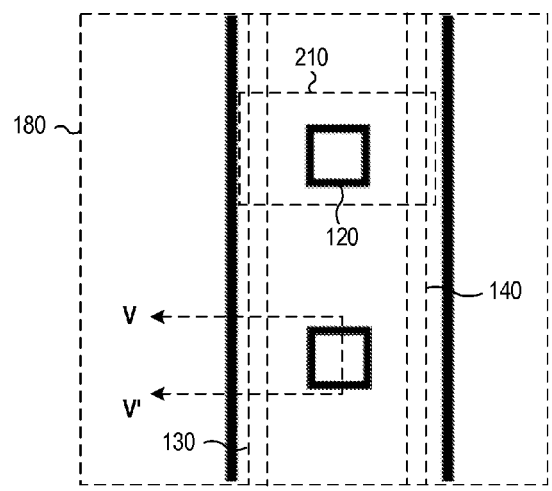
FIG. 2 is an overhead cross-sectional view of two lighting elements from the flexible lighting device of FIG. 1 according to disclosed embodiments.

FIG. 2 is an overhead cross-sectional window 180 of two lighting elements 120 from the flexible lighting device 100 of FIG. 1 according to disclosed embodiments. As shown in FIG. 2, the cross-sectional window 180 discloses that the lighting element 120 are formed in a lighting structure 210, in which first and second contact elements (not shown) are connected to the positive conductive element 130 and the negative conductive element 140, respectively.

The lighting structure 210 is configured to emit light, such as light of a specific wavelength (e.g., ultraviolet light, blue light, green light, infrared light, or any light with a wavelength between 10 nm and 100,000 nm) or light in a range of wavelengths (e.g., white light). In some embodiments the lighting elements 120 can include LEDs that emit light of a particular wavelength; in other embodiments the lighting elements 120 can include LEDs that emit light in a particular range of wavelengths; and in still other embodiments the lighting elements 120 can include LEDs that include lenses to focus, diffuse, or color the light.

In various disclosed embodiments, a first contact element is provided on a first side of the lighting element 120, and a second contact element is provided on the opposite side of the lighting.

In various disclosed embodiments, first and second conductive connectors can be provided to electrically connect the lighting element 120 to the positive and negative conductive elements 130, 140. In particular, the first contact element can be connected to the positive conductive element 130 through the first conductive connector. Likewise, the second contact element can be connected to the negative conductive element 140 through the second conductive connector.

Figure 3:
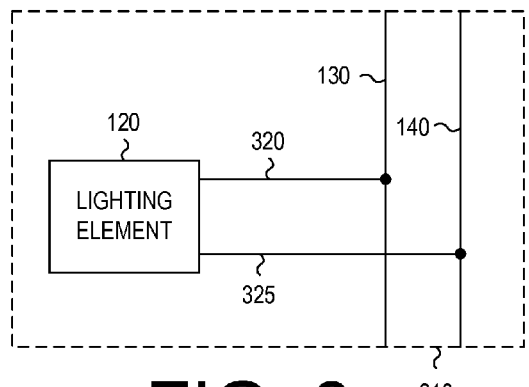
FIG. 3 is a circuit diagram showing the electrical connections of a lighting structure of FIG. 2 according to disclosed embodiments.

FIG. 3 is a circuit diagram showing the electrical connections of one of a lighting structure 210 in the cross-sectional window 180 of FIG. 2 according to disclosed embodiments. As shown in FIG. 3, a lighting element 120 is electrically connected to a positive conductive element 130 through a first conductive element 320. Similarly, the lighting element 120 is electrically connected to a negative conductive element 140 through a second conductive element 325.

Figure 4:
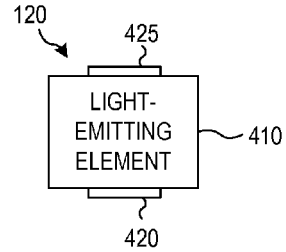
FIG. 4 is a side cross-sectional view of the single lighting element of FIG. 2 according to disclosed embodiments.

FIG. 4 is a side cross-sectional view of the lighting element 120 of FIG. 2 according to a disclosed embodiment. As shown in FIG. 4, the lighting element 120 in this embodiment includes a light-emitting element 410 having first and second contact elements 420, 425.

The light-emitting element 410 is configured to emit light, such as light of a specific wavelength (e.g., ultraviolet light, blue light, green light, infrared light, or any light with a wavelength between 10 nm and 100,000 nm), or light in a range of wavelengths (e.g., white light).

The first and second contact elements 420, 425 provide an external means for the light-emitting element 410 to be electrically connected to the positive and negative conductive element 130, 140. In the disclosed embodiments the first and second contact elements 420, 425 are contact pads. However, in alternate embodiments they could be any suitable means of electrically connecting the light-emitting element 410 with external elements. For example, in some alternate embodiments the first and second contact elements 420, 425 could be contact pins. When the light-emitting element 410 is an LED, the first contact element 420 is an anode, and the second contact element 425 is a cathode.

Figure 5:
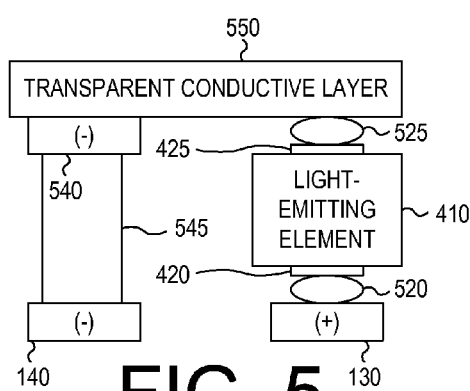
FIG. 5 is a side cross-sectional view of the lighting structure of FIG. according to disclosed embodiments.

FIG. 5 is a side cross-sectional view of the lighting structure 210 of FIG. 2 according to a disclosed embodiment. As shown in FIG. 5, the lighting structure 210 in this embodiment includes a light-emitting element 410 having first and second contact elements 420, 425, first and second conductive connectors 520, 525, positive conductive element 130, a transparent conductive flexible substrate 550, first and second negative conductive elements 140, 540, and connection element 545.

The light-emitting element 410, the positive and negative conductive elements 130, 140, and the first and the second contact elements 420, 425 operate as described above. As a result, the description will not be repeated here.

The first conductive connector 520 is configured to electrically connect the lighting element 120 to the positive conductive element 130. In particular, the first contact element 420 is connected to the positive conductive element 130 through the first conductive connector 520.

The second conductive connector 525 is configured to electrically connect the lighting element 120 to the first negative conductive element 140. In particular, the second contact element 425 is connected to the first negative conductive element 140 through the second conductive connector 525, the transparent conductive flexible substrate 550, the second negative conductive element 540, and the connection element 545.

In various embodiments, the conductive connectors 520, 525 can be: silver epoxy dots, conductive adhesive, metal pads, conductive daub pots, or other suitably conductive metal elements.

The second conductive element 540 runs parallel to and above the first conductive element 140, but is otherwise of similar construction. Thus, the second conductive element 540 is arranged at a height above the light-emitting element 410, and the first conductive element 140 is arranged near a height of the light-emitting element 410.

The connection element 545 is configured to electrically connect the second conductive element 540 to the first conductive element 140. In various embodiments, the connection element 545 can be silver epoxy dots, conductive adhesive, metal pads, conductive daub pots, or other suitably conductive metal elements.

The transparent conductive layer 550 can be a transparent conductive oxide (TCO) layer made of indium tin oxide, tin oxide, zinc oxide, carbon nanotubes, ultra thin metals, or any suitable transparent, conductive material.

The embodiment of FIG. 5 provides negative conductive elements 140, 540 with both an upper and a lower portion of the device 100. In this way, controls for the light-emitting elements 410 can be provided from a controller that has positive and negative outputs at the same level (i.e., the bottom level of the positive connection element 130 and the second negative connection element 140). Alternate embodiments could eliminate the connection element 545 and the second negative connection element 140, and simply use the first negative connection element 540 as the sole negative connection element.

In an effort to make the ribbon 110 in the lighting device 100 as appealing to the eye as possible, transparent materials are used wherever possible. At present, however, no truly transparent materials are available for the positive and negative conductive elements 130, 140. Therefore, several solutions are disclosed for making the positive and negative conductive elements 130, 140 as unobtrusive as possible to an observer. These solutions include: (1) using a semi-transparent material for the positive and negative conductive elements 130, 140, 540; (2) using a thin wire for the positive and negative conductive elements 130, 140, 540; and (3) obscuring the positive and negative conductive elements 130, 140, 540 with a design feature of the lighting device 100.

In this disclosure, when an element is described as "transparent," it will mean that the element is sufficiently transparent to visible light such that it will not decrease light transmittance through the element below 70%.

Flexible Lighting Device Using Semi-Transparent Conductive Elements

Figure 6:
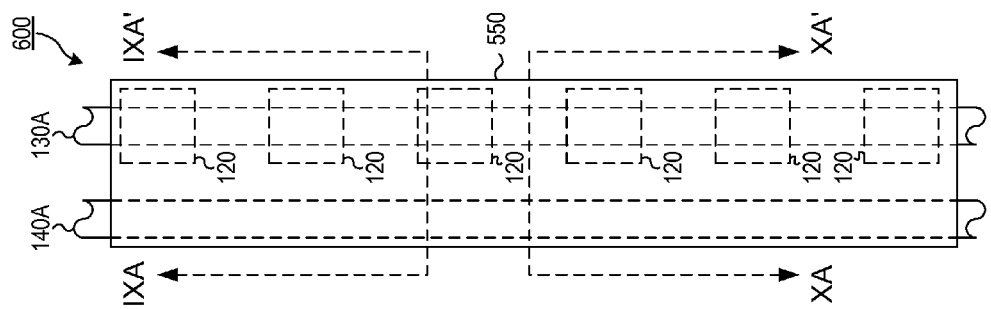
FIG. 6 is an overhead view of a portion of a lighting device having semi-transparent conductive elements according to a disclosed embodiment.

FIG. 6 is an overhead view of a portion of a lighting device 600 having semi-transparent conductive elements according to a disclosed embodiment. As shown in FIG. 6, the portion of a lighting device 600 includes a plurality of lighting elements 120, a semi-transparent positive conductive element 130A, a transparent conductive layer 550, and a semi-transparent negative conductive element 140A.

In this embodiment, the plurality of lighting elements 120 are formed directly above at least a portion of the semi-transparent positive conductive element 130A. As a result, a first contact element (not shown in FIG. 6) can connect directly to the semi-transparent positive conductive element 130A (e.g., it can connect directly via a first conductive connector, also not shown in FIG. 6).

The plurality of lighting elements 120 are not formed directly beneath any of the semi-transparent negative conductive element 140A. As a result, a second contact element (not shown in FIG. 6) does not connect directly to the semi-transparent negative conductive element 140A, but rather connects to it indirectly through a second contact element (not shown in FIG. 6) and the transparent conductive layer 550.

Figure 7:
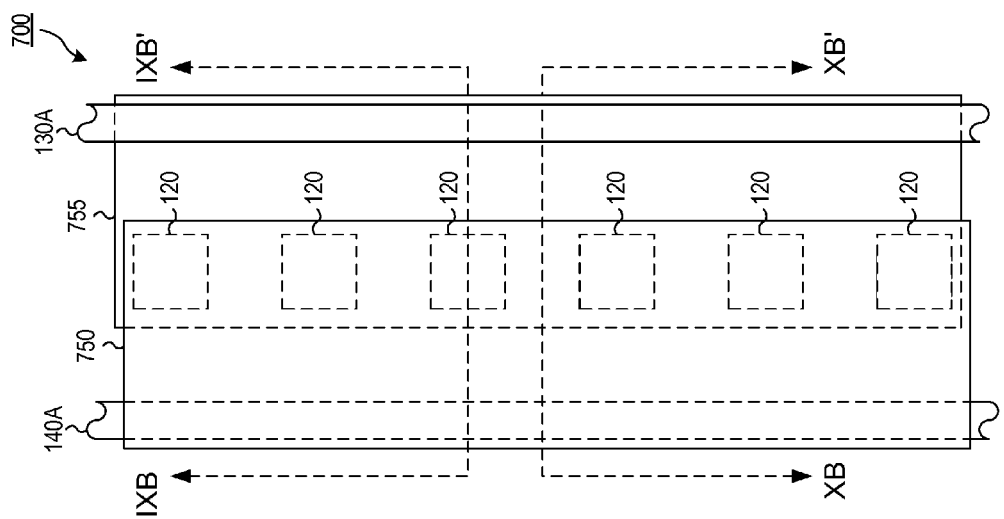
FIG. 7 is an overhead view of a portion of a lighting device having semi-transparent conductive elements according to another disclosed embodiment.

FIG. 7 is an overhead view of a portion of a lighting device 700 having semi-transparent conductive elements according to another disclosed embodiment. As shown in FIG. 7, the portion of the lighting device 700 includes a plurality of lighting elements 120, a first connecting layer 750, a second connecting layer 755, a semi-transparent positive conductive element 130A, and a semi-transparent negative conductive element 140A.

In this embodiment, the plurality of lighting elements 120 are not formed directly over the semi-transparent positive conductive element 130A, nor are they formed directly under the semi-transparent negative conductive element 140A. As a result, this embodiment requires a first connecting layer 750 to electrically connect second contact elements (not shown in FIG. 7) to the semi-transparent negative conductive element 140A, and a second connecting layer 755 to electrically connect first contact elements (not shown in FIG. 7) to the semi-transparent positive conductive element 130A. In this disclosed embodiment, the first connecting layer 750, 755 may both be transparent conductive oxide (TCO) layer, such as indium tin oxide, tin oxide, or zinc oxide.

Figure 8:
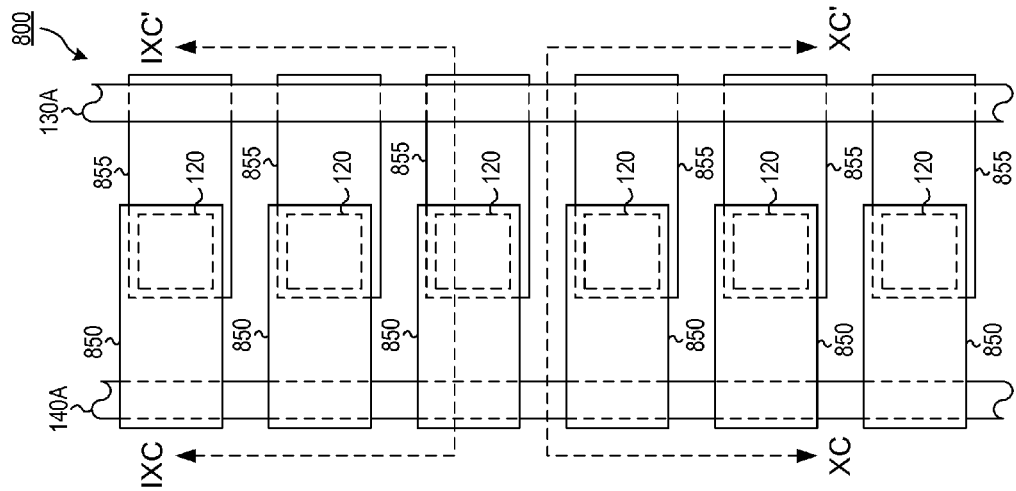
FIG. 8 is an overhead view of a portion of a lighting device having semi-transparent conductive elements according to yet another disclosed embodiment.

FIG. 8 is an overhead view of a portion of a lighting device 800 having semi-transparent conductive elements according to yet another disclosed embodiment. As shown in FIG. 8, the portion of the lighting device 800 includes a plurality of lighting elements 120, a plurality of first connecting layers 850, a plurality of second connecting layers 855, a semi-transparent positive conductive element 130A, and a semi-transparent negative conductive element 140A.

As with the embodiment of FIG. 7, the plurality of lighting elements 120 in this embodiment are not formed directly over the semi-transparent positive conductive element 130A, nor are they formed directly under the semi-transparent negative conductive element 140A. As a result, the plurality of first connecting layers 850 are provided to electrically connect second contact elements (not shown in FIG. 8) to the semi-transparent negative conductive element 140A, and the plurality of first connecting layers 855 are provided to electrically connect first contact elements (not shown in FIG. 8) to the semi-transparent positive conductive element 130A. In this disclosed embodiment, the plurality of first and second connecting layers 850, 855 may all be transparent conductive oxide (TCO) layers, such as indium tin oxide, tin oxide, or zinc oxide.

In each of FIGS. 6-8, a semi-transparent material is used for the positive and negative conductive elements 130A, 140A. Although not entirely transparent, such semi-transparent materials can serve to obscure the positive and negative conductive elements 130A, 140A, making them difficult to see, particularly from a distance. In various embodiments, the semitransparent material used for the positive and negative conductive elements 130A, 140A can include various ultra thin metals including copper, aluminum, stainless steel, and alloys of such materials.

It should be understood that although the designs in FIGS. 7 and 8 are all shown as being symmetrical, this is not required. In other words, in alternate embodiments the exact displacement of the semi-transparent conductive elements 130A, 140A with respect to the lighting elements 120 can vary.

Figure 9A:
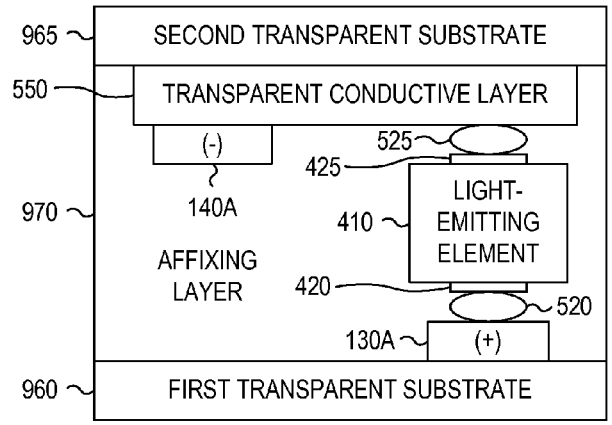
FIG. 9A is a side cross-sectional view of the portion of a lighting device of FIG. 6 along the line DCA-DCA' according to a disclosed embodiment.

FIG. 9A is a side cross-sectional view of the portion of a lighting device 600 of FIG. 6 along the line IXA-IXA' according to a disclosed embodiment. As shown in FIG. 9A, the portion of a lighting device 600 includes a first transparent substrate 960, semi-transparent positive and negative conductive elements 130A, 140A, a light-emitting element 410, first and second contact elements 420, 425, first and second conductive connectors 520, 525, a transparent conductive layer 550, a second transparent substrate 965, and an affixing layer 970.

The first transparent substrate 960 can be made of polyethylene terephthalate (PET), polyethylene napthalate (PEN), polyester, a polymer, an oxide-coated polymer, a flexible plastic, or any suitable material that is transparent to visible light. In alternate embodiments, the substrate 960 need not be transparent, and can simply serve as a backdrop for the lighting elements 120. In such an embodiment, it should be referred to as simply a first substrate 960. In embodiments in which the entire lighting device 600 is required to be flexible, the first transparent substrate 960 should be made of a flexible material.

The semi-transparent positive conductive element 130A is located on top of the first transparent substrate 960, and is made of a semi-transparent conductive material that is connected to the control circuit 150. Similarly, the semi-transparent negative conductive element 140A is located on the bottom of the transparent conductive layer 550, and is also made of a semi-transparent conductive material that is connected to the control circuit 150. The semi-transparent positive and negative conductive elements 130A, 140A are configured to carry a controlled current generated by the control circuit 150 to the lighting device 600. In various embodiments, the semi-transparent positive and negative conductive elements 130A, 140A can be made of various ultra thin metals including copper, aluminum, stainless steel, and alloys of such materials, having a width under 300 μm but still thick enough to carry ample electrical currents to power all of the lighting elements 120.

The transparent conductive layer 550 is applied underneath the second transparent substrate 965 and is configured to electrically connect the light-emitting element 410 to the semi-transparent conductive element 130A. The transparent conductive layer 550 can be a transparent conductive oxide (TCO) layer made of indium tin oxide, tin oxide, zinc oxide, carbon nanotubes, ultra thin metals, or any suitable transparent, conductive material.

Figure 10A:
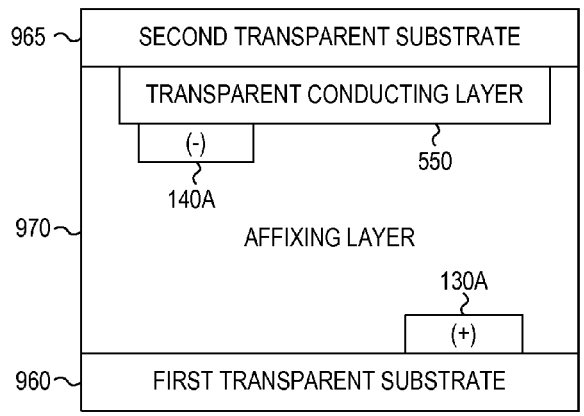
FIG. 10A is a side cross-sectional view of the portion of a lighting device of FIG. 6 along the line XA-XA' according to a disclosed embodiment.

In the embodiments disclosed in FIGS. 6, 9A, and 10A, the semi-transparent positive and negative conductive elements 130A, 140A are semi-transparent buss bars used to conduct electricity throughout the flexible lighting device 600. These semi-transparent buss bars are made of a material that is at least partially transparent to visible light. For example, the positive and negative conductive elements 130A, 140A in these embodiments can be made of various ultra thin metals including copper, aluminum, stainless steel, alloys of such materials, conductive epoxy, or conductive ink. In alternate embodiments they can be formed from any suitable semi-transparent structure used to conduct electricity throughout the flexible lighting device 600.

Figure 9B:
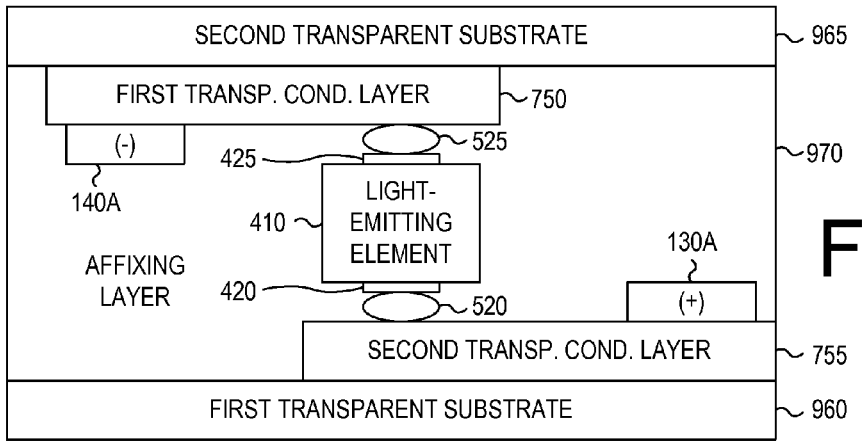
FIG. 9B is a side cross-sectional view of the portion of a lighting device of FIG. 7 along the line IXB-IXB' according to a disclosed embodiment.

FIG. 9B is a side cross-sectional view of the portion of a lighting device 700 of FIG. 7 along the line IXB-IXB' according to a disclosed embodiment. As shown in FIG. 9B, the portion of a lighting device 700 includes a first transparent substrate 960, first and second transparent connecting layers 750, 755, semi-transparent positive and negative conductive elements 130A, 140A, a light-emitting element 410, first and second contact elements 420, 425, first and second conductive connectors 520, 525, a second transparent substrate 965, and an affixing layer 970.

As shown in FIG. 9B, the first transparent connecting layer 750 is applied underneath the second transparent substrate 965, while the second transparent connecting layer 755 is formed over the first transparent substrate 960. The semi-transparent positive conductive element 130A is formed over the second transparent connecting layer 755, while the semi-transparent negative conductive element 140A is formed under the first transparent connecting layer 750. The light-emitting element 410 is formed under the first transparent connecting layer 750, such that a second contact element 425 connects to the first transparent connecting layer 750 through the second conductive connector 525. The light-emitting element 410 is formed over the second transparent connecting layer 755 such that a first contact element 420 connects to the second transparent connecting layer 755 through the first conductive connector 520.

The first and second transparent connecting layers 750, 755 can be made of any suitable transparent conducting material. For example, the first and second transparent connecting layer 750, 755 may be made of a transparent conducting oxide such as indium tin oxide, tin oxide, or zinc oxide.

Figure 9C:
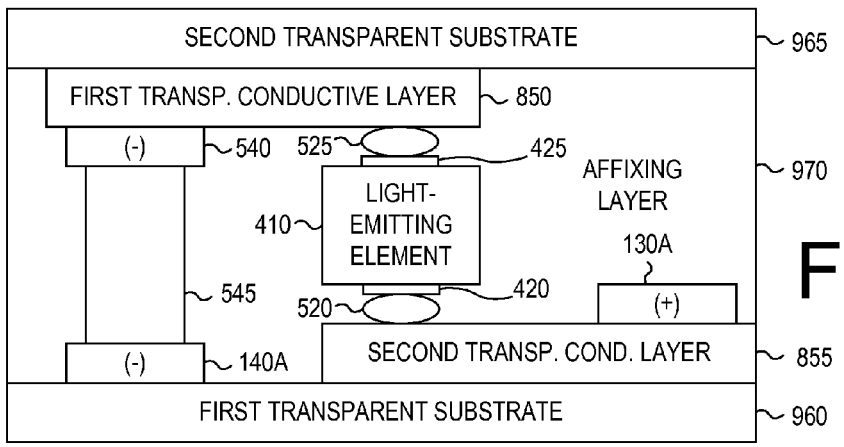
FIG. 9C is a side cross-sectional view of the portion of a lighting device of FIG. 8 along the line IXC-IXC' according to a disclosed embodiment.

FIG. 9C is a side cross-sectional view of the portion of a lighting device 800 of FIG. 8 along the line IXC-IXC' according to a disclosed embodiment. As shown in FIG. 9C, the portion of a lighting device 800 includes a first transparent substrate 960, first and second transparent connecting layers 850, 855, semi-transparent positive conductive element 130A, first and second semi-transparent negative conductive elements 540, 140A, a light-emitting element 410, first and second contact elements 420, 425, first and second conductive connectors 520, 525, a second transparent substrate 965, and an affixing layer 970.

FIG. 9C is similar to FIG. 9B, except for two primary differences. First, the transparent conductive layers 850, 855 represent an individual conducting layer for each light-emitting element 410. The transparent conductive layers 850, 855 can be made the same or similar material to be first and second transparent conductive layers 750, 755 in the embodiment of FIGS. 7, 9B, and 10B.

Second, the second negative conducting element 140A is provided on the first transparent substrate 960, while the first negative conducting element 540 is provided beneath the first transparent conductive layer. A connecting element 545 is provided between the first and second negative conducting elements 540, 140A.

FIG. 10A is a side cross-sectional view of the portion of a lighting device 600 of FIG. 6 along the line XA-XA' according to a disclosed embodiment. This cross-sectional view shows a point between lighting elements 120. As shown in FIG. 10A, the portion of a lighting device 600 includes a first transparent substrate 960, semi-transparent positive and negative conductive elements 130A, 140A, a transparent conductive layer 550, a second transparent substrate 965, and an affixing layer 970.

FIG. 10A is similar to FIG. 9A, save that the light-emitting element 410 and its connectors are not present. However, because the semi-transparent positive and negative conductive elements 130A, 140A extend the length of the flexible ribbon 110, they are present between lighting elements 120.

Figure 10B:
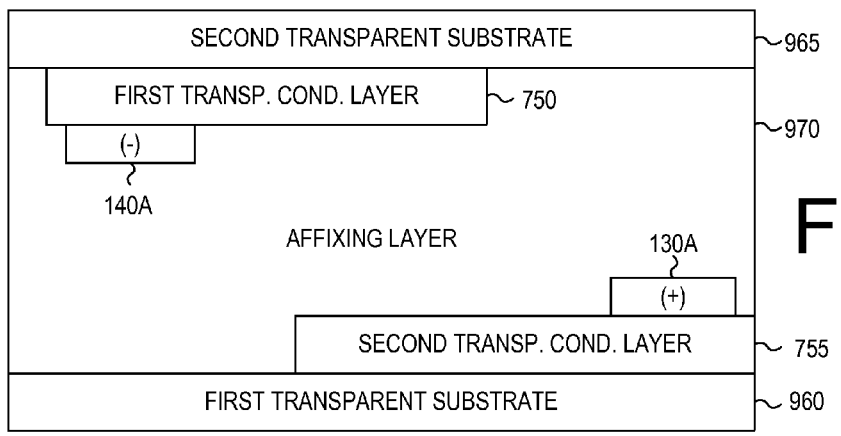
FIG. 10B is a side cross-sectional view of the portion of a lighting device of FIG. 7 along the line XB-XB' according to a disclosed embodiment.

FIG. 10B is a side cross-sectional view of the portion of a lighting device 700 of FIG. 7 along the line XB-XB' according to a disclosed embodiment. This cross-sectional view shows a point between lighting elements 120. As shown in FIG. 10B, the portion of a lighting device 700 includes a first transparent substrate 960, semi-transparent positive and negative conductive elements 130A, 140A, first and second transparent conductive layers 750, 755, a second transparent substrate 965, and an affixing layer 970.

FIG. 10B is similar to FIG. 9B, save that the light-emitting element 410 and its connectors are not present. However, because the semi-transparent positive and negative conductive elements 130A, 140A and the first and second transparent conductive layers 750, 755 extend the length of the flexible ribbon 110, they are present between lighting elements 120.

Figure 10C:
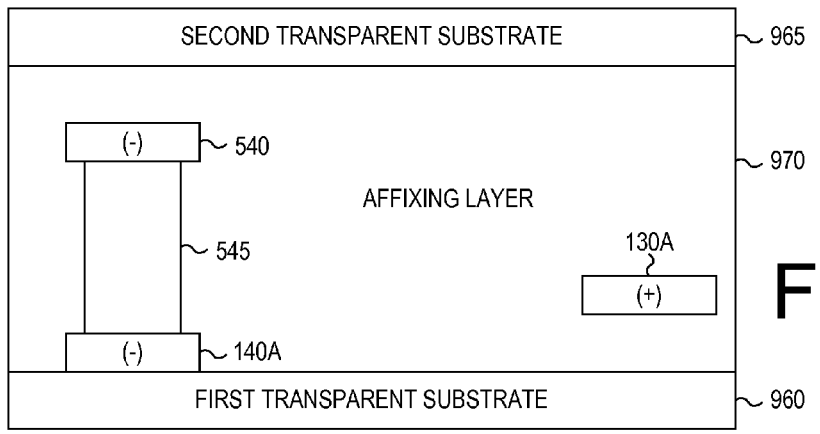
FIG. 10C is a side cross-sectional view of the portion of a lighting device of FIG. 8 along the line XC-XC' according to a disclosed embodiment.

FIG. 10C is a side cross-sectional view of the portion of a lighting device 800 of FIG. 8 along the line XC-XC' according to a disclosed embodiment. This cross-sectional view shows a point between lighting elements 120. As shown in FIG. 10C, the portion of a lighting device 800 includes a first transparent substrate 960, semi-transparent positive conductive element 130A, first and second semi-transparent negative conductive elements 540, 140A, a second transparent substrate 965, and an affixing layer 970.

FIG. 10C is similar to FIG. 9C, save that the light-emitting element 410 and its connectors, as well as the first and second transparent conductive layers 850, 855 are not present. However, because the semi-transparent positive conductive element 130A, the first and second semi-transparent negative conductive elements 540, 140A, and the connecting element 545 extend the length of the flexible ribbon 110, they are present between lighting elements 120. Although there is a gap shown between the semi-transparent positive conductive element 130A and the first flexible substrate 960, the semi-transparent positive conductive element 130A is supported by the plurality of first and second transparent conductive layers 850, 855, as well as the affixing layer 970.

In the embodiments of FIGS. 6-10C, if the lighting device 100 must remain flexible, the positive and negative conductive elements 130A, 140A, 540 should also be configured such that they can bend without breaking or losing their ability to carry a current.

The light-emitting element 410 is configured to generate light based on the control current carried on the semi-transparent positive and negative conductive elements 130A, 140A, 540. One exemplary light-emitting element 410 used in the disclosed embodiments is a light-emitting diode (LED). An LED has an anode (i.e., a positive side) and a cathode (i.e., a negative side), and operates to generate light of a specific wavelength (from infrared to ultraviolet, i.e., having a wavelength from 10 nm to 100,000 nm) when current flows through the LED from the anode to the cathode.

In alternate embodiments, the various features of FIGS. 6-10C can be mixed and matched. For example, an embodiment with a single first transparent conductive layer 750 and a single second transparent conductive layer 755 (as shown in the embodiment of FIG. 7) could employ first and second negative conductive elements 540, 140A (as shown in the embodiment of FIG. 8). Likewise, an embodiment with multiple first transparent conductive layers 850 and multiple second transparent conductive layers 855 (as shown in the embodiment of FIG. 8) could employ a single negative conductive element 140A are located at a height above the light emitting element (as shown in the embodiment of FIG. 7). Other combinations of elements are, of course, possible.

In alternate embodiments, a phosphor layer may be deposited above the light-emitting element 410. This may be a separate layer, or combined with the second transparent substrate. A phosphor layer operates to scatter light emitted from the top surface of the light-emitting element 410. When the light emitted by the light-emitting element 410 is within the wavelength spectrum between ultraviolet and blue light (i.e., from about 10 nm to 490 nm), a phosphor layer scatters the emitted light such that it becomes white light. In this way, when the light-emitting elements 410 is a light-emitting diode (LED) that emits light of a single wavelength, the resulting lighting element 120 can generate white light. For this reason, many manufacturers of LEDs will manufacture blue- or ultraviolet-emitting diodes that include a phosphor layer already applied to the light-emitting surface of the LED.

In addition, other alternate embodiments can include a lens deposited over the light-emitting element 410. Such a lens could be provided for a variety of purposes. It could operate to focus the light emitted from the light-emitting element 410 in order to increase light output by allowing light to be emitted perpendicular to the surface of the second transparent substrate 965; it could act to diffuse light emitted from the light-emitting element 410 to allow light to be emitted at a larger angle of incidence from the light-emitting element 410; or it could be a colored lens that acts to color the light emitted from the light-emitting element 410.

Furthermore, alternate embodiments can include one or both of a heat sink and a heat spreading layer attached to the bottom of the first flexible substrate 960 (i.e., the side opposite the side on which the remainder of elements are located). A heat sink operates to dissipate heat from the lighting elements 120, while a heat spreader operates to spread the heat such that it is not focused on the point just underneath the lighting elements 120. A heat sink can be a flexible metal layer (e.g., a metal tape), a flexible ceramic thin-film layer, any flexible material that dissipates heat sufficiently, or even a collection of small (e.g., less than ½" in length) metal pieces. A heat spreader can be a flexible metal layer (e.g., a metal tape), a flexible ceramic thin-film layer, or any flexible material that spreads heat sufficiently.

In addition, although the embodiments disclosed above use a second transparent substrate 965, the second transparent substrate can be replaced in alternate embodiments with a transparent conformal coat that is deposited over the light emitting element 410 and then hardened.

Flexible Lighting Device Using Thin Wire Conductive Element

FIG. 11 is an overhead view of a portion of a lighting device 1100 having a thin wire conductive element according to a disclosed embodiment. As shown in FIG. 11, the portion of a lighting device 1100 includes a plurality of lighting elements 120, a thin-wire positive conductive element 130B, a transparent conductive layer 550, and a thin-wire negative conductive element 140B.

In this embodiment, the plurality of lighting elements 120 are formed directly above at least a portion of the thin-wire positive conductive element 130A. As a result, a first contact element (not shown in FIG. 11) can connect directly to the thin-wire positive conductive element 130A (e.g., it can connect directly via a first conductive connector, also not shown in FIG. 11).

The plurality of lighting elements 120 are not formed directly beneath any of the thin-wire negative conductive element 140B. As a result, a second contact element (not shown in FIG. 11) does not connect directly to the thin-wire negative conductive element 140B, but rather connects to it indirectly through a second contact element (not shown in FIG. 11) and the transparent conductive layer 550.

FIG. 12 is an overhead view of a portion of a lighting device 1200 having thin wire conductive elements according to another disclosed embodiment. As shown in FIG. 12, the portion of the lighting device 1200 includes a plurality of lighting elements 120, a first connecting layer 750, a second connecting layer 755, a thin-wire positive conductive element 130B, and a thin-wire negative conductive element 140B.

In this embodiment, the plurality of lighting elements 120 are not formed directly over the thin-wire positive conductive element 130B, nor are they formed directly under the thin-wire negative conductive element 140B. As a result, this embodiment requires a first connecting layer 750 to electrically connect second contact elements (not shown in FIG. 12) to the thin-wire negative conductive element 140B, and a second connecting layer 755 to electrically connect first contact elements (not shown in FIG. 12) to the thin-wire positive conductive element 130B. In this disclosed embodiment, the first connecting layer 750, 755 may both be transparent conductive oxide (TCO) layer, such as indium tin oxide, tin oxide, or zinc oxide.

FIG. 13 is an overhead view of a portion of a lighting device 1300 having thin-wire conductive elements according to yet another disclosed embodiment. As shown in FIG. 13, the portion of the lighting device 1300 includes a plurality of lighting elements 120, a plurality of first connecting layers 850, a plurality of second connecting layers 855, a thin-wire positive conductive element 130B, and a thin-wire negative conductive element 140B.

As with the embodiment of FIG. 12, the plurality of lighting elements 120 in this embodiment are not formed directly over the semi-transparent positive conductive element 130B, nor are they formed directly under the semi-transparent negative conductive element 140B. As a result, the plurality of first connecting layers 850 are provided to electrically connect second contact elements (not shown in FIG. 13) to the semi-transparent negative conductive element 140B, and the plurality of first connecting layers 855 are provided to electrically connect first contact elements (not shown in FIG. 13) to the semi-transparent positive conductive element 130B. In this disclosed embodiment, the plurality of first and second connecting layers 850, 855 may all be transparent conductive oxide (TCO) layers, such as indium tin oxide, tin oxide, or zinc oxide.

In each of FIGS. 11-13, a thin wire is used for the positive and negative conductive elements 130B, 140B. Although not transparent, the use of thin wires can obscure the positive and negative conductive elements 130B, 140B from an observer, making them difficult to see, particularly from a distance.

As with the designs of FIGS. 6-8, it should be understood that although the designs in FIGS. 7 and 8 are all shown as being symmetrical, this is not required. In other words, in alternate embodiments the exact displacement of the semi-transparent conductive elements 130A, 140A with respect to the lighting elements 120 can vary.

Figure 14A:
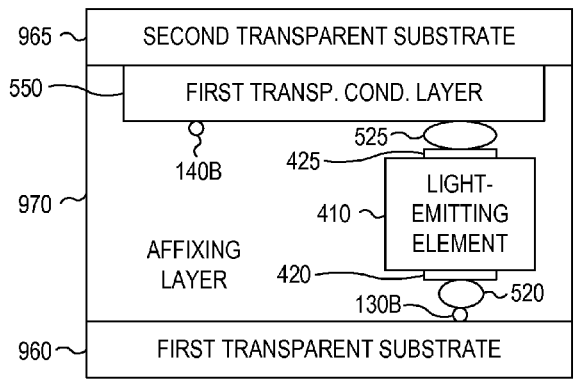
FIG. 14A is a side cross-sectional view of the portion of a lighting device of FIG. 11 along the line XIVA-XIVA' according to a disclosed embodiment.

FIG. 14A is a side cross-sectional view of the portion of a lighting device 1100 of FIG. 11 along the line XIVA-XIVA' according to a disclosed embodiment. As shown in FIG. 14A, the portion of a lighting device 1100 includes a first transparent substrate 960, thin-wire positive and negative conductive elements 130B, 140B, a light-emitting element 410, first and second contact elements 420, 425, first and second conductive connectors 520, 525, a second transparent substrate 965, and an affixing layer 970.

The thin-wire positive conductive element 130B is located on top of the first transparent substrate 960, and is made of a thin-wire conductive material that is connected to the control circuit 150. Similarly, the thin-wire negative conductive element 140B is located on the bottom of the transparent conductive layer 550, and is also made of a thin-wire conductive material that is connected to the control circuit 150. The semi-transparent positive and negative conductive elements 130B, 140B are configured to carry a control current generated by the control circuit 150 to the lighting device 1100.

The transparent conductive layer 550 is formed underneath the second transparent substrate 965 and is configured to electrically connect the light-emitting element 410 to the thin-wire conductive element 140B.

Figure 14B:
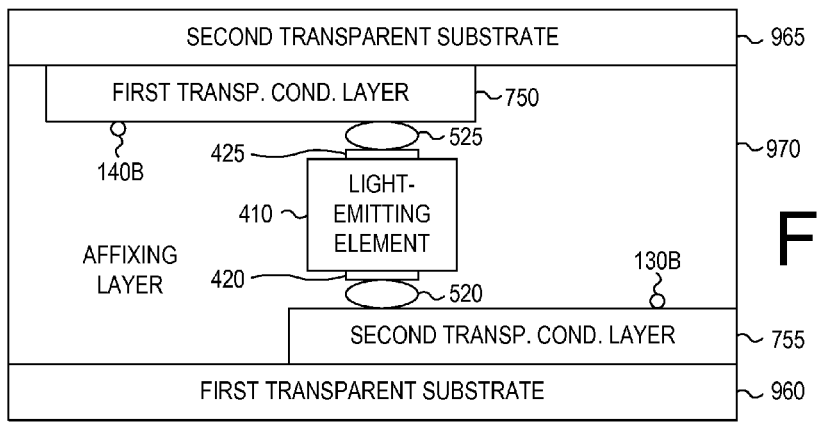
FIG. 14B is a side cross-sectional view of the portion of a lighting device of FIG. 12 along the line XIVB-XIVB' according to a disclosed embodiment.

FIG. 14B is a side cross-sectional view of the portion of a lighting device 1200 of FIG. 12 along the line XIVB-XIVB' according to a disclosed embodiment. As shown in FIG. 14B, the portion of a lighting device 1200 includes a first transparent substrate 960, first and second transparent connecting layers 750, 755, thin-wire positive and negative conductive elements 130B, 140B, a light-emitting element 410, first and second contact elements 420, 425, first and second conductive connectors 520, 525, a second transparent substrate 965, and an affixing layer 970.

As shown in FIG. 14B, the first transparent connecting layer 750 is formed under the second transparent substrate 965, while the second transparent connecting layer 755 is formed over the first transparent substrate 960. The thin-wire positive conductive element 130A is formed over the second transparent connecting layer 755, while the thin-wire negative conductive element 140A is formed under the first transparent connecting layer 750. The light-emitting element 410 is formed under the first transparent connecting layer 750, such that a second contact element 425 connects to the first transparent connecting layer 750 through the second conductive connector 525. The light-emitting element 410 is formed over the second transparent connecting layer 755 such that a first contact element 420 connects to the second transparent connecting layer 755 through the first conductive connector 520.

Figure 14C:
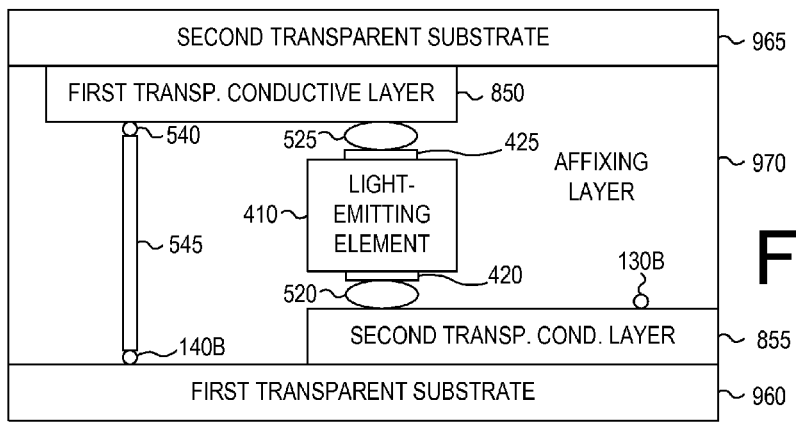
FIG. 14C is a side cross-sectional view of the portion of a lighting device of FIG. 13 along the line XIVC-XIVC' according to a disclosed embodiment.

FIG. 14C is a side cross-sectional view of the portion of a lighting device 1300 of FIG. 13 along the line XIVC-XIVC' according to a disclosed embodiment. As shown in FIG. 14C, the portion of a lighting device 1300 includes a first transparent substrate 960, first and second transparent connecting layers 850, 855, thin-wire positive and negative conductive elements 130B, 140B, a light-emitting element 410, first and second contact elements 420, 425, first and second conductive connectors 520, 525, a second transparent substrate 965, and an affixing layer 970.

FIG. 14C is similar to FIG. 14B, except for two primary differences. First, the transparent conductive layers 850, 855 represent an individual conducting layer for each light-emitting element 410. The transparent conductive layers 850, 855 can be made the same or similar material to be first and second transparent conductive layers 750, 755 in the embodiment of FIGS. 12, 14B, and 15B.

Second, the second negative conducting element 140B is provided on the first transparent substrate 960, while the first negative conducting element 540 is provided beneath the first transparent conductive layer. A connecting element 545 is provided between the first and second negative conducting elements 540, 140B.

Figure 15A:
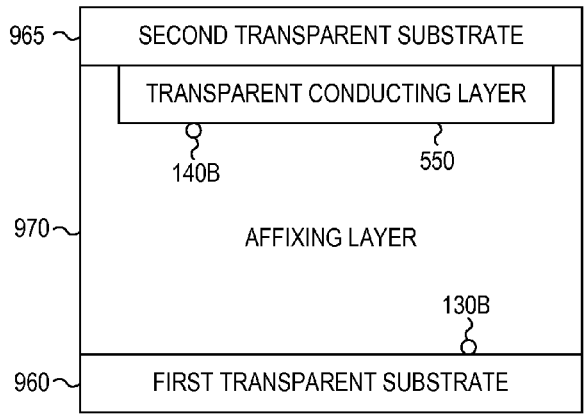
FIG. 15A is a side cross-sectional view of the portion of a lighting device of FIG. 11 along the line XVA-XVA' according to a disclosed embodiment.

FIG. 15A is a side cross-sectional view of the portion of a lighting device 1100 of FIG. 11 along the line XVA-XVA' according to a disclosed embodiment. This cross-sectional view shows a point between lighting elements 120. As shown in FIG. 15A, the portion of a lighting device 1100 includes a first transparent substrate 960, thin-wire positive and negative conductive elements 130B, 140B, a second transparent substrate 965, and an affixing layer 970.

FIG. 15A is similar to FIG. 14A, save that the light-emitting element 410 and its connectors are not present. However, because the thin-wire positive and negative conductive elements 130B, 140B, and the transparent conductive layer 550 extend the length of the flexible ribbon 110, they are present between lighting elements 120.

Figure 15B:
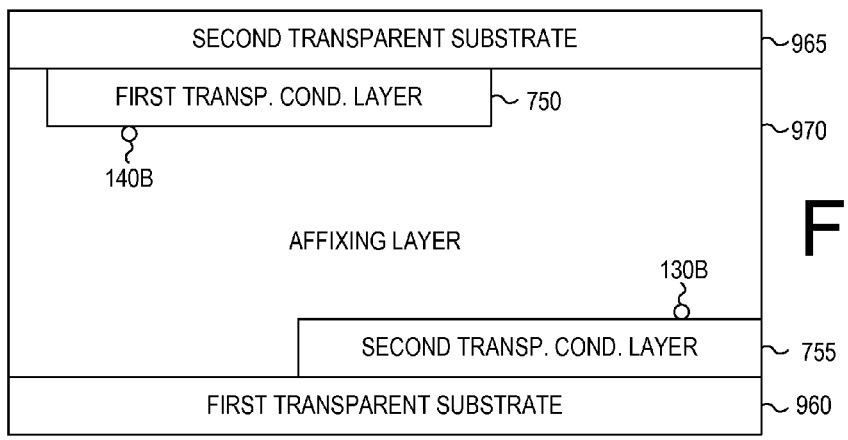
FIG. 15B is a side cross-sectional view of the portion of a lighting device of FIG. 12 along the line XVB-XVB' according to a disclosed embodiment.

FIG. 15B is a side cross-sectional view of the portion of a lighting device 1200 of FIG. 12 along the line XVB-XVB' according to a disclosed embodiment. This cross-sectional view shows a point between lighting elements 120. As shown in FIG. 15B, the portion of a lighting device 1200 includes a first transparent substrate 960, thin-wire positive and negative conductive elements 130B, 140B, first and second transparent conductive layers 750, 755, a second transparent substrate 965, and an affixing layer 970.

FIG. 15B is similar to FIG. 14B, save that the light-emitting element 410 and its connectors are not present. However, because the thin-wire positive and negative conductive elements 130B, 140B and the first and second transparent conductive layers 750, 755 extend the length of the flexible ribbon 110, they are present between lighting elements 120.

Figure 15C:
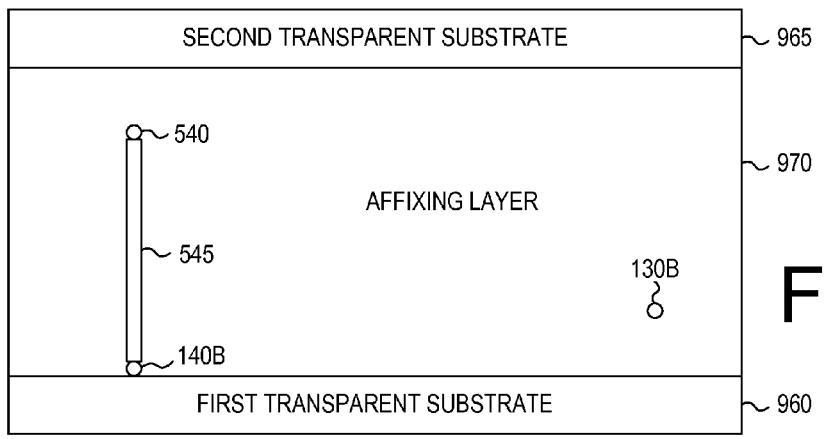
FIG. 15C is a side cross-sectional view of the portion of a lighting device of FIG. 13 along the line XVC-XVC' according to a disclosed embodiment.

FIG. 15C is a side cross-sectional view of the portion of a lighting device 1300 of FIG. 13 along the line XVC-XVC' according to a disclosed embodiment. This cross-sectional view shows a point between lighting elements 120. As shown in FIG. 15C, the portion of a lighting device 1300 includes a first transparent substrate 960, thin wire positive and negative conductive elements 130B, 140B, the plurality of first and second transparent conductive layers 850, 855, a second transparent substrate 955, and an affixing layer 970.

FIG. 15C is similar to FIG. 14C, save that the light-emitting element 410 and its connectors, as well as the plurality of first and second transparent conductive layers 850, 855 are not present. However, because the thin-wire positive and negative conductive elements 130B, 140B extend the length of the flexible ribbon 110, they are present between lighting elements 120. Although there is a gap shown between the thin-wire negative conductive element 140B and the first flexible substrate 960, and between the thin-wire positive conductive element 130B and the second flexible substrate 965, the thin-wire positive and negative conductive elements 130B, 140B are supported by the plurality of first and second transparent conductive layers 850, 855, as well as the affixing layer 970.

In the embodiments disclosed in FIGS. 11-15C, the thin-wire positive and negative conductive elements 130B, 140B are conductive wires, having a thickness less than 300 microns, used to conduct electricity throughout the flexible lighting device 100. These thin-wire conductive elements can be made of copper, aluminum, or any suitable conductive material.

In addition, if the lighting device 100 must remain flexible, the first and second thin-wire conductive elements 130, 140 should also be configured such that they can bend without breaking or losing their ability to carry a current.

The light-emitting element 410 is configured to generate light based on the control current carried on the thin wire first and second conductive elements 130B, 140B. One exemplary light-emitting element 410 used in the disclosed embodiments is a light-emitting diode (LED). An LED has an anode (i.e., a positive side) and a cathode (i.e., a negative side), and operates to generate light of a specific wavelength (from infrared to ultraviolet, i.e., having a wavelength from 10 nm to 100,000 nm) when current flows through the LED from the anode to the cathode.

As with the embodiments disclosed above using a semi-transparent conductive element 130A, 140A, embodiments using a thin-wire conductive element 130B, 140B; can deposit a phosphor layer above the light emitting element 410, can deposit a lens above the light emitting element 410, can include one or both of a heat sink and a heat spreading layer attached to the bottom of the first transparent substrate 960, and can replace the second transparent substrate 965 with a transparent conformal coat.

Flexible Lighting Device-Concealed Buss Bar

Figure 16A:
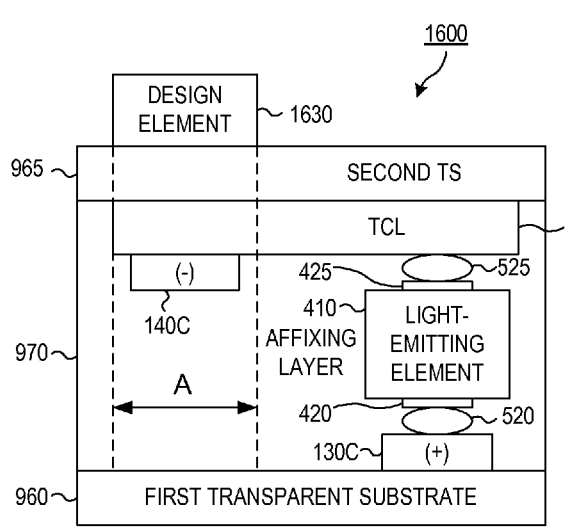
FIG. 16A is a side cross-sectional view of the flexible lighting device of FIG. 6 along the line IXA-IXA' where the conductive elements are obscured by design features according to yet another disclosed embodiment.
Figure 16B:
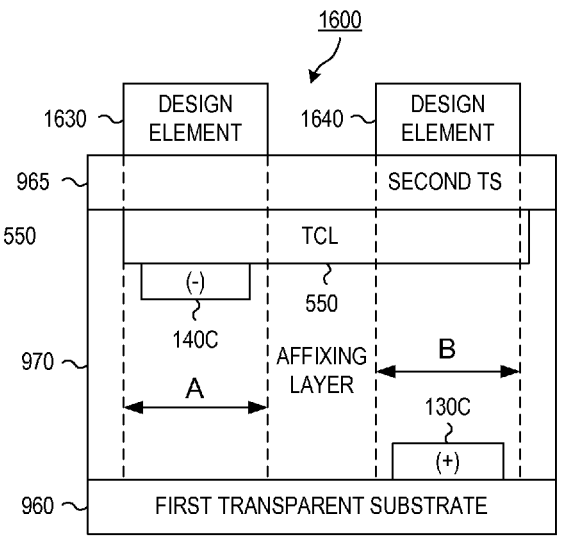
FIG. 16B is a side cross-sectional view of the flexible lighting device of FIG. 6 along the line XA-XA' where the conductive elements are obscured by design features according to yet another disclosed embodiment.

FIG. 16A is a side cross-sectional view of the flexible lighting device 1600 similar to that of FIG. 6 along the line IXB-IXB', in which the conductive elements are concealed by design features according to yet another disclosed embodiment. FIG. 16B is a side cross-sectional view of the flexible lighting device 1600 similar to that of FIG. 6 along the line XB-XB', in which the conductive elements are obscured by design features according to yet another disclosed embodiment.

As shown in FIG. 16A, the portion of a lighting device 1600 includes a first transparent substrate 960, positive and negative conductive elements 130C, 140C, a light-emitting element 410, first and second contact elements 420, 425, first and second conductive connectors 520, 525, a transparent conductive layer 550, a second transparent substrate 965, an affixing layer 970, and first and second design elements 1630, 1640.

The first transparent substrate 960 serves as a base for the remainder of the lighting device 1600. As a reference direction, the first flexible substrate 960 can be considered to be a "bottom" substrate upon which the other elements are stacked. However, this is as a point of reference only. The lighting device 1600 has no inherent direction, and can be oriented in any manner, even with the first transparent substrate 960 being on the "top" of the structure.

The transparent conductive layer 550 is formed underneath the second transparent substrate 965 and is configured to electrically connect the light-emitting element 410 to the negative conductive element 140C. The transparent conductive layer 550 can be a transparent conductive oxide (TCO) layer made of indium tin oxide, tin oxide, zinc oxide, carbon nanotubes, ultra thin metals, or any suitable transparent, conductive material.

The positive conductive element 130C is located over the first transparent substrate 960. The negative conductive element 140C is located underneath, and electrically contacting, the transparent conductive layer 550. Each is made of a conductive material that is connected to the control circuit 150, and is configured to carry a control current generated by the control circuit 150 throughout the lighting device 1600. In various embodiments, the positive and negative conductive elements 130C, 140C can be made of various metals including copper, aluminum, stainless steel, alloys of such materials, conductive epoxy, or conductive inks. There is no requirement in this embodiment for the positive and negative conductive elements 130C, 140C to either be made of a semi-transparent material or to be made of a thin wire, since the positive and negative conductive elements 130C, 140C will be obscured by the first and second design elements 1670, 1675.

The first design element 1630 is formed over exposed portions of the negative conductive element 140C, and serves to partly or completely conceal the negative conductive element 140C from view in a selected viewing direction. It has a width A that is at least as wide as the width of the exposed portions of the negative conductive element 140C, and a length at least as long as the length of the exposed portions of the negative conductive element 140C. No design element is required to cover the positive conductive element 130C in this part of the device 1600, because the light-emitting element 410 obscures the positive conductive element 130C from view from above.

As shown in FIG. 16B, the portion of a lighting device 1600 includes a first transparent substrate 960, positive and negative conductive elements 130C, 140C, a transparent conductive layer 550, a second transparent substrate 965, an affixing layer 970, and first and second design elements 1630, 1640.

FIG. 16B is similar to FIG. 16A, save that the light-emitting element 410 and its connectors are not present. However, because the positive and negative conductive elements 130C, 140C extend the length of the flexible ribbon 110, they are present between lighting elements 120. Furthermore, the first design element covers the negative conductive element 140C, just as in FIG. 16A. However, in this portion of the device 1600, the second design element 1640 is formed over exposed portions of the positive conductive element 130C, and serves to partly or completely conceal the positive conductive element 130C from view in the selected viewing direction. It has a width B that is at least as wide as the width of the exposed portions of the positive conductive element 130C, and a length at least as long as the length of the exposed portions of the positive conductive element 130C between adjacent light-emitting elements 410.

Figure 17A:
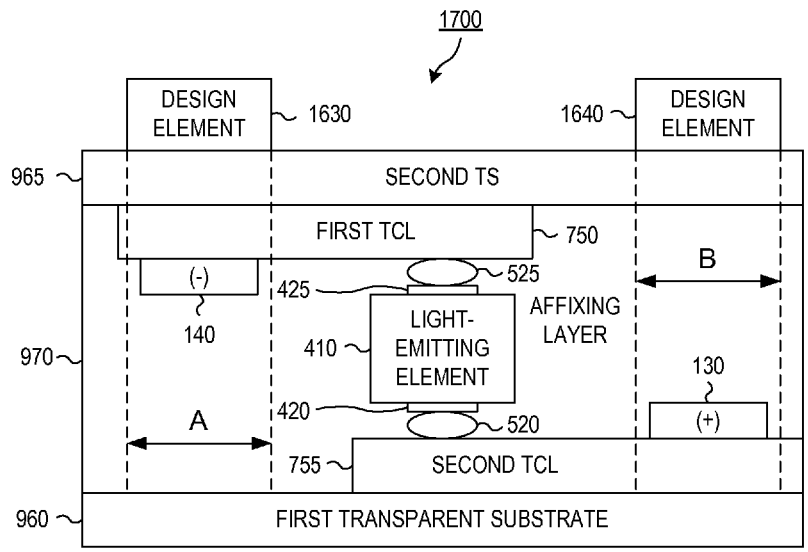
FIG. 17A is a side cross-sectional view of the flexible lighting device of FIG. 7 along the line IXB-IXB' where the conductive elements are obscured by design features according to yet another disclosed embodiment.
Figure 17B:
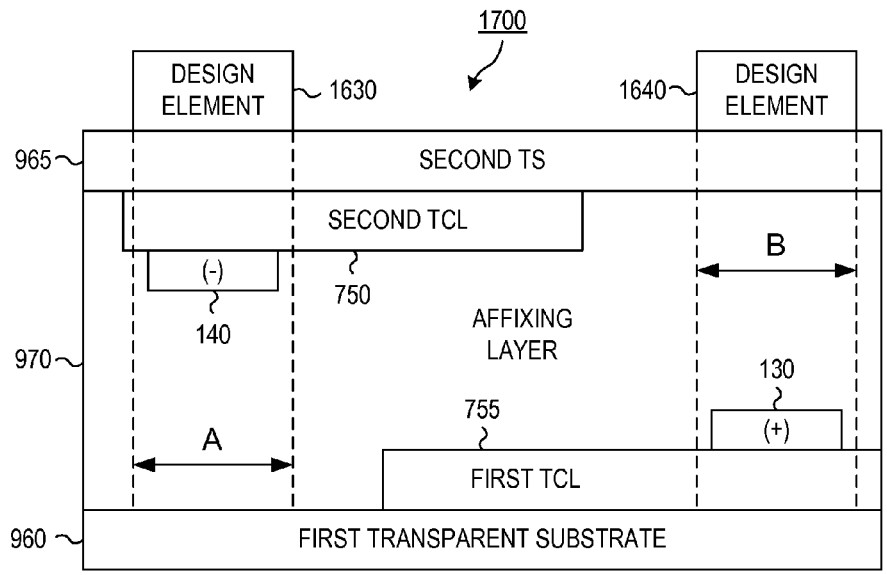
FIG. 17B is a side cross-sectional view of the flexible lighting device of FIG. 7 along the line XB-XB' where the conductive elements are obscured by design features according to yet another disclosed embodiment.

FIG. 17A is a side cross-sectional view of the flexible lighting device 1700 similar to that of FIG. 7 along the line IXB-IXB', in which the conductive elements are obscured by design features according to yet another disclosed embodiment. FIG. 17B is a side cross-sectional view of the flexible lighting device 1700 similar to that of FIG. 7 along the line XB-XB', in which the conductive elements are obscured by design features according to yet another disclosed embodiment.

As shown in FIG. 17A, the portion of a lighting device 1700 includes a first transparent substrate 960, positive and negative conductive elements 130C, 140C, a light-emitting element 410, first and second contact elements 420, 425, first and second conductive connectors 520, 525, first and second transparent conductive layers 750, 755 a second transparent substrate 965, an affixing layer 970, and first and second design elements 1630, 1640.

FIG. 17A is similar to FIG. 16A, except that the positive conductive element 130C has been moved from under the light-emitting element 410, and a second transparent conductive layer 755 is has been added to electrically connect the positive conductive element 130C to the light-emitting element 410. (The transparent conductive layer 550 has simply been renamed and renumbered as the first transparent conductive layer 750.)

The first design element 1630 is formed over exposed portions of the negative conductive element 140C, and serves to obscure the negative conductive element 140C from view in a selected viewing direction. It has a width A that is at least as wide as the width of the exposed portions of the negative conductive element 140C, and a length at least as long as the length of the exposed portions of the negative conductive element 140C. Similarly, the second design element 1640 is formed over exposed portions of the positive conductive element 130C, and serves to obscure the positive conductive element 130C from view in the selected viewing direction. It has a width B that is at least as wide as the width of the exposed portions of the positive conductive element 130C, and a length at least as long as the length of the exposed portions of the positive conductive element 130C.

In various embodiments, the first and second design elements 1630, 1640 can be any decorative or functional feature that can serve to obscure the positive and negative conductive elements 130C, 140C. For example, they could be a frame for the lighting device 100 or decorative stripes running the length of the lighting device.

As with the embodiments disclosed above using semi-transparent conductive elements 130A, 140A, or thin wire conductive elements 130B, 140B, alternate embodiments using an obscured conductive element 130C, 140C can deposit a phosphor layer above the light emitting element 410, can deposit a lens above the light emitting element 410, can include one or both of a heat sink and a heat spreading layer attached to the bottom of the first transparent substrate 960, and can replace the second transparent substrate 965 with a transparent conformal coat.

Method of Manufacturing a Flexible Lighting Device

Figure 18A:
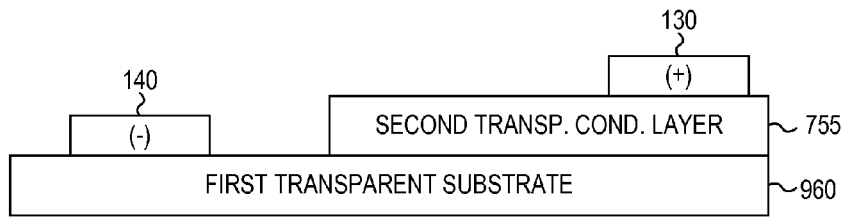
FIGS. 18A-18D are side cross-sectional views illustrating a manufacturing process of the flexible lighting device of FIGS. 7 and 8 according to disclosed embodiments.
Figure 18B:
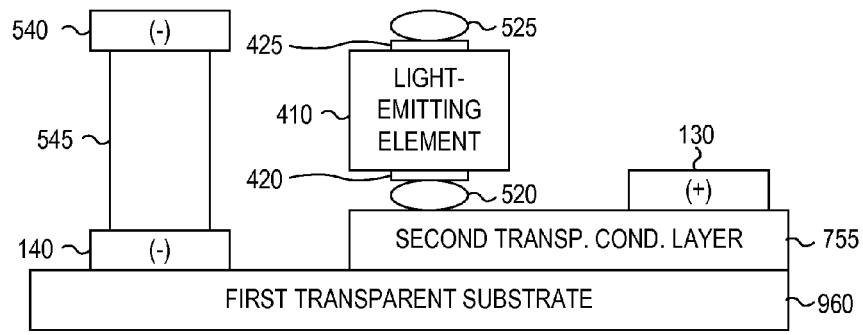
Figure 18C:
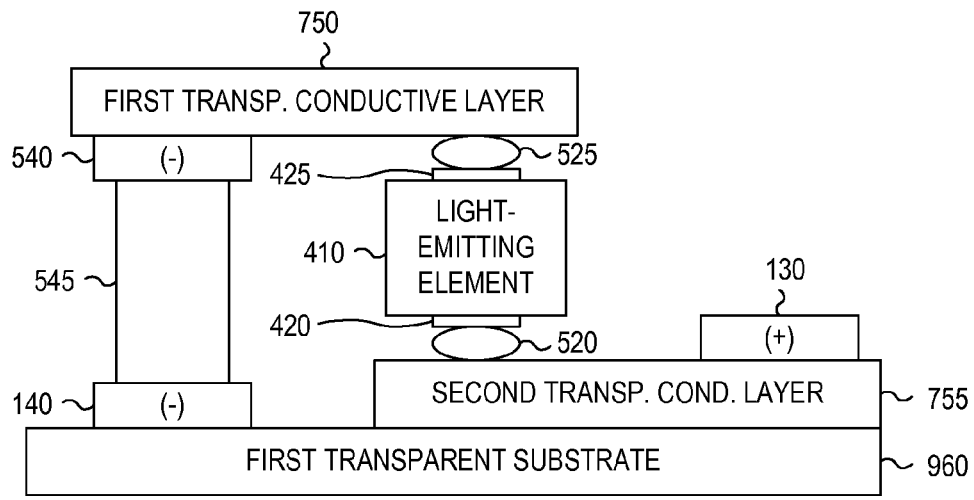

FIGS. 18A-18C are side cross-sectional views illustrating a manufacturing process of the flexible lighting device 800 of FIG. 8 according to disclosed embodiments. FIG. 19 is a flow chart showing a manufacturing process 1900 of a lighting device according to disclosed embodiments.

As shown in FIGS. 18A and 19, the manufacturing process 1900 begins by providing a first transparent substrate 960 (1910).

As shown in FIGS. 18A and 19, a first electrical connecting structure is then formed over the first transparent substrate (1920). In the embodiment shown in FIG. 18A, the first electrical connecting structure includes a second transparent conductive layer 755 formed over the first transparent substrate 960, and a positive conductive element 130 formed over the first transparent conductive layer 755. However, alternate embodiments can employ different first electrical connecting structures. For example, in some embodiments the first electrical connecting structure can be formed from only the positive conductive element 130.

As shown in FIGS. 18B and 19, the manufacturing process 1900 continues as the lighting element 120 is formed over the first electrical connecting structure, such that it is electrically connected to the first electrical connecting structure (1930).

In the embodiment disclosed in FIG. 18B, a light-emitting element 410 is brought into contact with the first connecting conductor 520, which then contacts the second transparent conductive layer 755. In particular, the first connecting element 420 on the light-emitting element 410 comes into contact with the first conducting connector 520.

As shown in FIGS. 18A-C and 19, the manufacturing process 1900 continues as a second electrical connecting structure is formed over the first transparent substrate 960 and the lighting element 120 (1940).

In the embodiment shown in FIGS. 18A-18C, the second electrical connecting structure includes a second negative conductive element 140 formed over the first transparent substrate 960, a connecting element 545 formed over the second negative conductive element 140, a first negative conductive element 540 formed over the connecting element 545, and a first transparent conductive layer 750 formed over the first negative conductive element 540 and the light-emitting element 410. In this way, the second negative conductive element 140 is electrically connected to a second contact element 425 of the light-emitting element 410 through the connecting element 545, the first negative conductive element 540, the first transparent conductive layer 750, and the second conductive connector 525. However, alternate embodiments can employ different second electrical connecting structures. For example, in some embodiments the second electrical connecting structure can be formed from only the negative conductive element 140 and the first transparent conductive layer 750.

Typically this process 1900 also involves a baking step after the second electrical connecting structure is formed, to dry the connection (i.e., the first and second conducting connectors 520, 525.)

In this way the light-emitting element 410 is attached to the first and second electrical connecting structures, which can provide control signals to the light-emitting element 410. In the embodiment disclosed in FIG. 18C, a first connecting element 420 of the light-emitting element 410 is connected to the first electrical connecting structure, which serves as a positive control line. Likewise, a second connecting element 425 of the light-emitting element 410 is connected to the second electrical connecting structure, which serves as a negative control line.

Figure 18D:
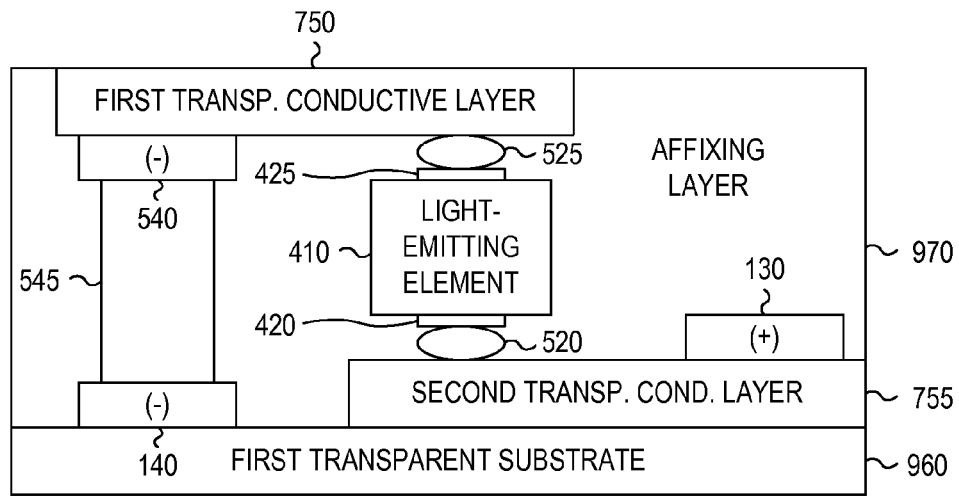

As shown in FIGS. 18D and 19, the manufacturing process 1900 continues as a transparent affixing material 970 is formed over the entire structure (1950).

As shown in FIGS. 9C and 19, the manufacturing process 1900 continues as a second transparent substrate 965 is formed over the entire structure (1960). In such an operation, the first and second transparent substrates 960, 965 are pressed together to fix them to each other via the transparent affixing material 970. During this process, the transparent affixing material 970 will flow around the light-emitting elements 410 and the first and second electrical connecting structures such that it does not disturb these elements, but also affixes them in place.

In this manufacturing process 1900, little to none of the transparent affixing material 970 remains between the light-emitting elements 410 and the second transparent substrate 965. However, in alternate embodiments, some portion of the transparent affixing material 970 may remain between the light-emitting elements 410 and the second transparent substrate 965.

In one particular embodiment, the transparent affixing material 970 can be initially affixed to one side of the second transparent substrate 965, and then the two pressed down on the rest of the structure. However, this is by way of example only. In alternate embodiments, the transparent affixing material 970 could initially be applied first to the first transparent substrate 960, the first and second electrical connecting structures, and the light-emitting elements 410. Alternatively, both the first and second transparent substrates 960, 965 can be combined with the transparent affixing material 970 simultaneously.

FIGS. 20A and 20B are flow charts showing a process of forming a first electrical connecting structure over a first transparent substrate from FIG. 19 according to disclosed embodiments.

As shown in FIG. 20A, the process of forming a first electrical connecting structure (1820) may be as simple as forming a positive conductive element 130 over the transparent substrate 960 (2010).

In this case, the first electrical connecting structure is formed from the positive conductive element 130 alone. An exemplary resultant structure can be seen in FIGS. 6 and 9A.

As shown in FIG. 20B, the process of forming a first electrical connecting structure (1820) may also include forming a second transparent conductive layer 755 over the first transparent substrate 960 (2020) and forming a positive conductive element 130 over the second transparent conductive layer 755 (2030).

In this case, the first electrical connecting structure is formed from the second transparent conductive layer 755 and the positive conductive element 130. Exemplary resultant structures can be seen in FIGS. 7, 8, 9B, and 9C.

FIG. 21 is a flow chart showing a process of forming a light element over the first connecting structure (1930) from FIG. 19 according to a disclosed embodiment.

As shown in FIG. 21, this process can include forming a first conductive material 520 on a first electrical conducting structure (2110), placing a light-emitting element 410 on the first conductive material 520 such that a first electrode 420 on the light-emitting element 410 connects to the first conductive material 520 (2120), and forming a second conductive material 525 on a second electrode 425 on the light-emitting element (2130).

The first and second conductive connectors 520, 525 may be formed from: silver epoxy dots, a conductive epoxy, metal pads, conductive daub pots, or any other suitable conductive material.

FIGS. 22A and 22B are flow charts showing a process of forming a second electrical connecting structure over the first transparent substrate and the light-emitting element from FIG. 19 according to disclosed embodiments.

As shown in FIG. 22A, the process of forming a first electrical connecting structure (1820) may be as simple as forming a first transparent conducting layer 750 over the light-emitting element 410 and the first transparent substrate 960, and forming a negative conductive element 140 under the first transparent conducting layer 750 and not over the light-emitting element 410 (2210).

In this case, the first electrical connecting structure is formed from the first transparent conducting layer 750 and the negative conductive element 140. Exemplary resultant structures can be seen in FIGS. 6, 7, 9A and 9B.

As shown in FIG. 22B, the process of forming a second electrical connecting structure (1940) may also include forming a second negative conductive element 140 over the first transparent substrate 960 (2230), forming a connecting element 545 over the second negative conductive element 140 (2240), forming a first negative connecting element 540 over the connecting element 545 (2250), and forming a first transparent conductive layer 750 over the first negative conductive element 540 and the light-emitting element 410 (2260).

In this case, the second electrical connecting structure is formed from the first transparent conductive layer 750, the first negative conductive element 140, the connecting element 545, and the second negative conductive element 140. An exemplary resultant structure can be seen in FIGS. 8 and 9C.

Figure 23:
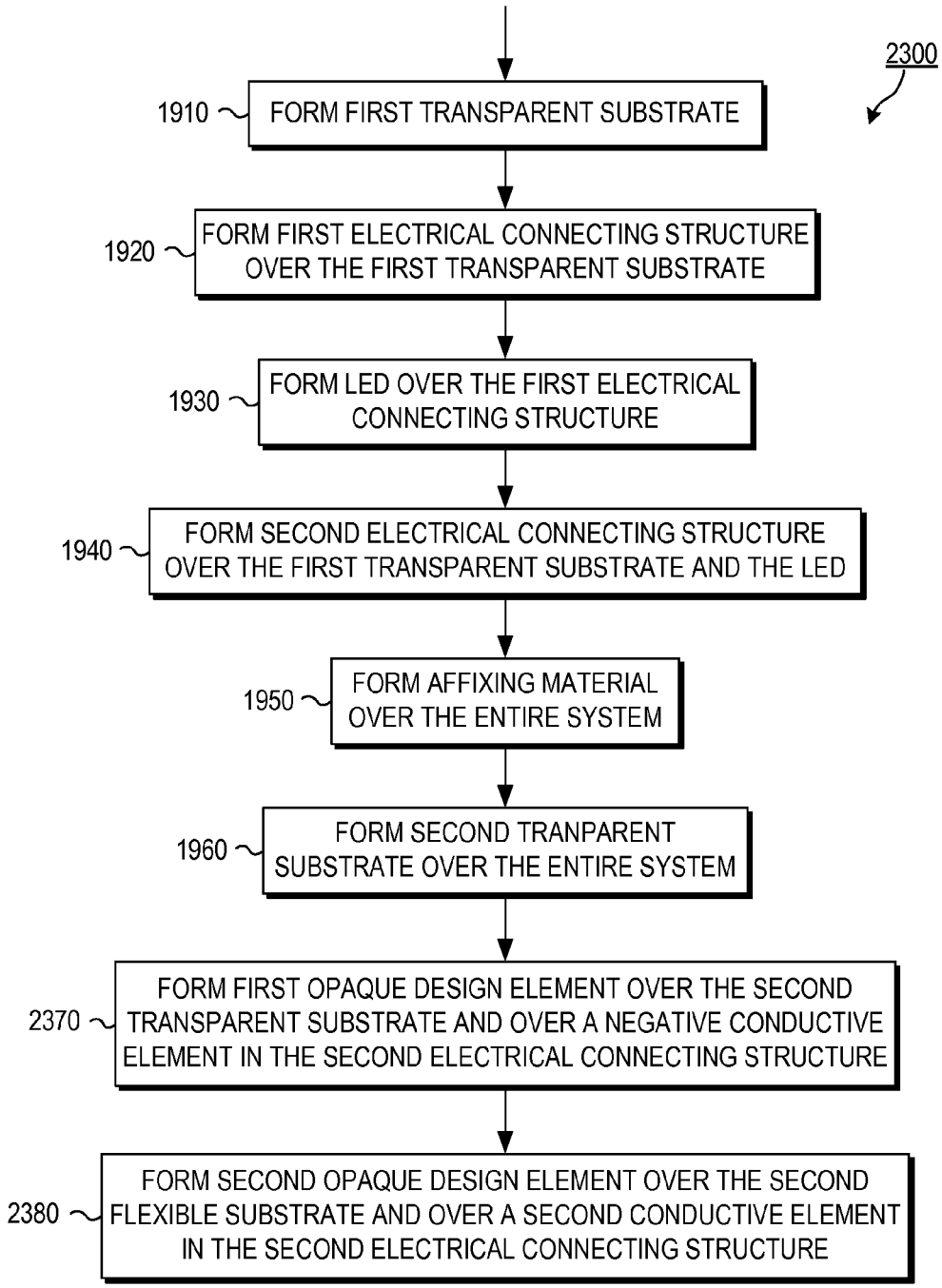
FIG. 23 is a flow chart showing a manufacturing process of a lighting device according to other disclosed embodiments.

FIG. 23 is a flow chart showing a manufacturing process 2300 of a lighting device according to other disclosed embodiments. The manufacturing process 2300 of FIG. 23 is the same as the process 1900 of FIG. 19, except for the addition of two operations. The common operations will not be described here, as they are described above with respect to FIG. 19.

As shown in FIG. 23, after the second transparent substrate is formed over the entire system (1960), a first opaque design element 1630 is formed over the second transparent substrate 965 and over a negative conductive element 140 in the second electrical connecting structure (2370). Also, a second opaque design element 1640 is formed over the second transparent substrate 965 and over a positive conductive element 130 in the first electrical connecting structure (2380). Exemplary resultant structures can be seen in FIGS. 16A-17B.

Although this method discloses forming a first opaque design element 1630 before the second opaque design element 1640, these operations can be reversed, or even performed at the same time.

Although in each of the above described embodiments, the negative conductive element 140 is shown as being connected to the top of the light-emitting element 410, and the positive conductive element 130 is shown as being connected to the bottom of the light-emitting element 410, these connections could be reversed in alternate embodiments. In such case, the above descriptions would apply, except the positive and negative conductive elements 130, 140 would be swapped.

Although the drawings with respect to the above manufacturing process show the conductive elements 130, 140 as being conductive layers, such as a semi-transparent or opaque buss bar (130A, 140A, or 130C, 140C), the described process is equally applicable to embodiments in which the conductive elements 130, 140 are conductive thin wires (130B, 140B).

Although FIGS. 18A-23 disclose layers formed only on top of the first transparent substrate 960, in alternate embodiments one or both of a heat spreader or a heat sink may be attached to a bottom of the first transparent substrate 960.

In addition, in alternate embodiments a phosphor layer and/or a lens can be deposited above the light-emitting element 410. The second transparent substrate 965 may also be replaced with a transparent conformal coat, which is deposited in a viscous state and later hardened.

Individually-Controlled Light-Emitting Elements

Figure 24:
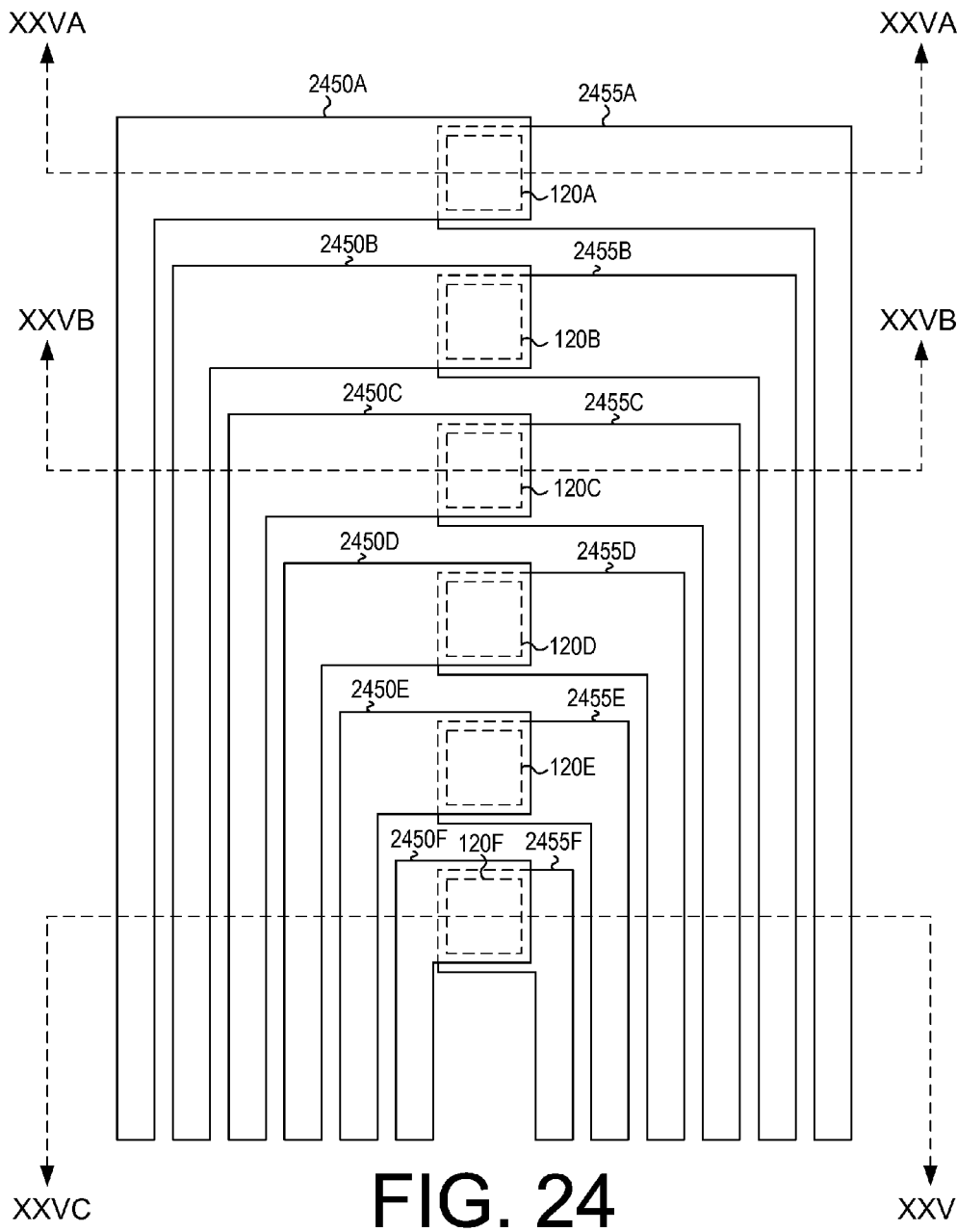
FIG. 24 is an overhead view of a portion of a lighting device in which individual lighting elements can be selectively activated according to yet another disclosed embodiment.

FIG. 24 is an overhead view of a portion of a lighting device 2400 in which individual lighting elements 120 can be selectively activated according to yet another disclosed embodiment. As shown in FIG. 24, the lighting device 2400 includes a plurality of lighting elements 120A-120F, a plurality of negative transparent conductive layers 2450A-2450F, and a plurality of positive transparent conductive layers 2455A-2455F.

The plurality of lighting elements 120A-120F can be any suitable light-emitting element 410, including first and second connection electrodes (not shown in FIG. 24) on opposite sides of the light-emitting element 410.

The plurality of negative transparent conductive layers 2450A-2450F are isolated from each other, and are configured to connect to the second connection electrodes on the top of each of the plurality of lighting elements 120A-120F, respectively.

The plurality of positive transparent conductive layers 2455A-2455F are isolated from each other, and are configured to connect to the first connection electrodes on the bottom of each of the plurality of lighting elements 120A-120F, respectively.

In this way, signals sent along corresponding pairs of negative and positive transparent conductive layers (2450A and 2455A, 2450B and 2455B, etc.) can be used to individually control each of the plurality of lighting elements 120A-120F.

FIG. 25A is a side cross-sectional view of the flexible lighting device of FIG. 24 along the line XVA-XVA' according to a disclosed embodiment. This cross-sectional view is at a first lighting element 120A.

As shown in FIG. 25A, a second positive transparent conductive layer 2455A is formed over a first transparent substrate 960. A first conductive connector 520A is then formed over the first positive transparent conductive layer 2455A.

A first light-emitting element 410A is placed on the first positive conductive connector 520A such that a first connecting electrode 420A of the first light-emitting element 410A is connected to the first conductive connector 520A. In this way the first connecting electrode 420A is electrically connected to the first positive transparent conductive layer 2455A.

A second conductive connector 525A is then formed on a second connecting electrode 425A of the first light-emitting element 410A. A first negative transparent conductive layer 2450A is then formed over both the first transparent substrate 960 and the first light-emitting element 410A, such that the first negative transparent conductive layer 2450A contacts the second conductive connector 525A. In this way, the second connecting electrode 425A is electrically connected to the first negative transparent conductive layer 2450A.

Because this is the first light-emitting element 410A, the first positive and negative transparent conductive layers 2450A, 2455A extend a width sufficient to allow room for all subsequent transparent conductive layers (i.e., positive transparent conductive layers 2450B-2450F and negative transparent conductive layers 2455B-2455F) to be formed in a manner such that each are isolated from the first positive and negative transparent conductive layers 2150A, 2155A, and from one another.

FIG. 25B is a side cross-sectional view of the flexible lighting device of FIG. 24 along the line XVB-XVB' according to a disclosed embodiment. This cross-sectional view is at a third lighting element 120C.

As shown in FIG. 25B, a third positive transparent conductive layer 2455C is formed over a first transparent substrate 960. A first conductive connector 520C is then formed over the third positive transparent conductive layer 2455C.

A third light-emitting element 410C is placed on the first positive conductive connector 520C such that a first connecting electrode 420C of the third light-emitting element 410C is connected to the first conductive connector 520C. In this way the first connecting electrode 420C is electrically connected to the third positive transparent conductive layer 2455C.

A second conductive connector 525C is then formed on a second connecting electrode 425C of the third light-emitting element 410C. A third negative transparent conductive layer 2450C is then formed over both the first transparent substrate 960 and the third light-emitting element 410C, such that the third negative transparent conductive layer 2450C contacts the second conductive connector 525C. In this way, the second connecting electrode 425C is electrically connected to the third negative transparent conductive layer 2450C.

In addition, first and second positive transparent conductive layers 2455A, 2455B run alongside the third positive transparent conductive layer 2155C in such a way as to be isolated from the third positive transparent conductive layer 2455C and from each other. Likewise, first and second negative transparent conductive layers 2450A, 2150B run alongside the third negative transparent conductive layer 2450C in such a way as to be isolated from the third negative transparent conductive layer 2450C and from each other.

A third light-emitting element 410C is connected to the first and second conductive connectors 520C, 525C such that a first connecting electrode 420C of the third light-emitting element 410C is connected to the first conductive connector 520C, and a second connecting electrode 425C of the third light-emitting element 410C is connected to the second conductive connector 525C. In this way the first connecting electrode 420C is electrically connected to the third positive transparent conductive layer 2455C, and the second connecting electrode 425C is electrically connected to the third negative transparent conductive layer 2450C.

Because this is the third light-emitting element 410C, the third negative and positive transparent conductive layers 2450C, 2455C extend a width sufficient to allow room for all subsequent transparent conductive layers (i.e., positive transparent conductive layers 2455D-2455F and negative transparent conductive layers 2450D-2450F) to be formed in a manner such that each are isolated from the third positive and negative transparent conductive layers 2455D, 2450D, and from one another.

Figure 25C:
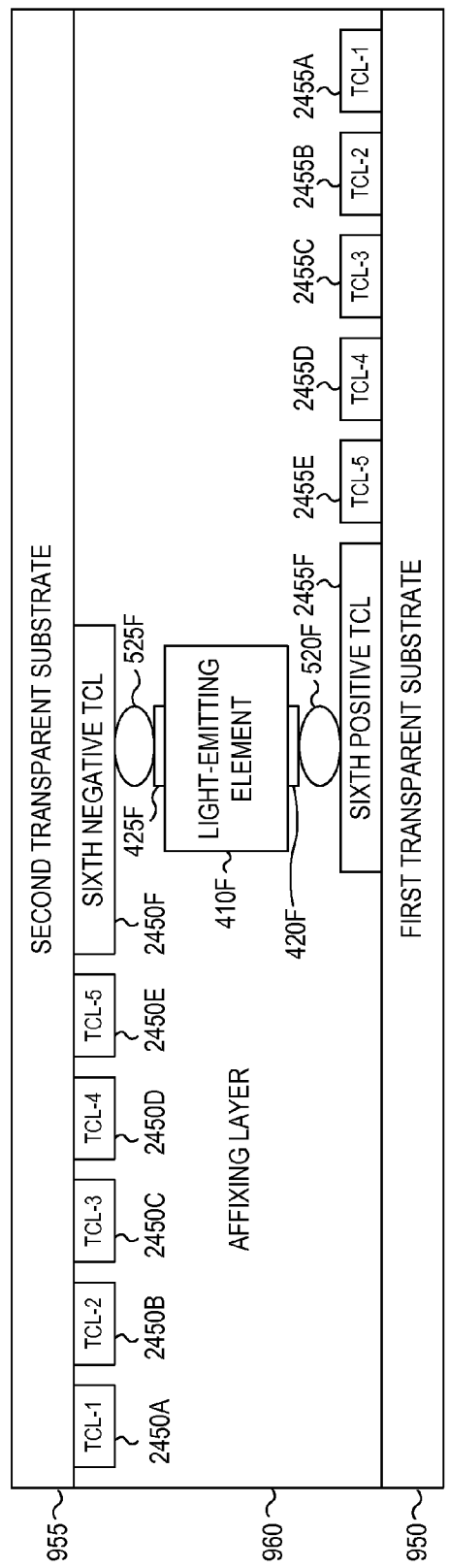
FIG. 25C is a side cross-sectional view of the flexible lighting device of FIG. 24 along the line XXVC-XXVC' according to a disclosed embodiment.

FIG. 25C is a side cross-sectional view of the flexible lighting device of FIG. 24 along the line XVC-XVC' according to a disclosed embodiment. This cross-sectional view is at a sixth lighting element 120F.

As shown in FIG. 25C, a sixth positive transparent conductive layer 2455F is formed over a first transparent substrate 960. A first conductive connector 520F is then formed over the sixth positive transparent conductive layer 2455C.

A sixth light-emitting element 410F is placed on the first positive conductive connector 520F such that a first connecting electrode 420F of the sixth light-emitting element 410F is connected to the first conductive connector 520F. In this way the first connecting electrode 420F is electrically connected to the sixth positive transparent conductive layer 2455F.

A second conductive connector 525F is then formed on a second connecting electrode 425F of the sixth light-emitting element 410F. A sixth negative transparent conductive layer 2450F is then formed over both the first transparent substrate 960 and the sixth light-emitting element 410F, such that the sixth negative transparent conductive layer 2450F contacts the second conductive connector 525F. In this way, the second connecting electrode 425F is electrically connected to the sixth negative transparent conductive layer 2450F.

In addition, first through fifth positive transparent conductive layers 2455A-2455E run alongside the sixth positive transparent conductive layer 2155F in such a way as to be isolated from the sixth positive transparent conductive layer 2455F and from each other. Likewise, first through fifth negative transparent conductive layers 2450A-2150E run alongside the sixth negative transparent conductive layer 2450F in such a way as to be isolated from the sixth negative transparent conductive layer 2450F and from each other.

A sixth light-emitting element 410F is connected to the first and second conductive connectors 520F, 525F such that a first connecting electrode 420F of the sixth light-emitting element 410F is connected to the first conductive connector 520F, and a second connecting electrode 425F of the sixth light-emitting element 410F is connected to the second conductive connector 525F. In this way the first connecting electrode 420F is electrically connected to the sixth positive transparent conductive layer 2455F, and the second connecting electrode 425F is electrically connected to the sixth negative transparent conductive layer 2450F.

Because this is the sixth (and last) light-emitting element 410F, the sixth positive and negative transparent conductive layers 2455F, 2450F do not need to extend beyond a minimum amount required to provide a width sufficient to allow the sixth positive and negative transparent conductive layers 2455F, 2450F to clear the sixth light-emitting element 410F.

In the embodiment disclosed in FIGS. 24-25C, the positive and negative transparent conductive layers 2455A-2455F, 2450A-2450F may be made of a material such as copper, aluminum, stainless steel, conductive epoxy, conductive inks, and alloys of such materials.

In these embodiments, the light-emitting elements 410 are configured to generate light based on the control currents carried on the relevant pair of positive and negative transparent conductive layers 2455, 2450. One exemplary light-emitting element 410 used in the disclosed embodiments is an inorganic light-emitting diode (ILED). An ILED has an anode (i.e., a positive side) and a cathode (i.e., a negative side), and operates to generate light of a specific wavelength (from infrared to ultraviolet, i.e., having a wavelength from 10 nm to 100,000 nm) when current flows through the ILED from the anode to the cathode.

As with the embodiments disclosed above using a semi-transparent conductive element 130A, 140A, embodiments using a plurality of positive and negative transparent conductive layers 2455, 2450, can deposit a phosphor layer above the light emitting element 410, can deposit a lens above the light emitting element 410, can include one or both of a heat sink and a heat spreading layer attached to the bottom of the first transparent substrate 960, and can replace the second transparent substrate 965 with a transparent conformal coat.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A lighting element, comprising:
   a first flexible substrate;
   a first conductive element located on the first flexible substrate;
   a light-emitting element having a first contact and a second contact, the first contact being on a first surface of the light-emitting element, the second contact being on a second surface of the light-emitting element that is opposite to the first side;
   a flexible transparent layer located adjacent to the second surface of the light-emitting element;
   a transparent affixing layer located between the first flexible substrate and the flexible transparent layer, the affixing layer being configured to affix the flexible transparent layer to the first flexible substrate; and
   a second conductive element located beneath the flexible transparent layer and proximate to the second surface of the light-emitting element,
   wherein
   the first contact is electrically connected to the first conductive element,
   the second contact is electrically connected to the second conductive element,
   the light-emitting element is configured to emit light from the second surface with the light having wavelengths between 10 nm and 100,000 nm,
   the flexible transparent layer and the transparent affixing layer are both sufficiently transparent to visible light such that they will not decrease light transmittance below 70%, and
   the first and second conductive elements are at least partially transparent to visible light.

2. The lighting element of claim 1, further comprising:
   a second transparent conductive layer formed at least partially adjacent to the second contact and at least partially adjacent to the second conductive element, the second transparent conductive layer configured to electrically connect the second contact and the second conductive element,
   wherein the second transparent conductive layer is sufficiently transparent to visible light such that they will not decrease light transmittance below 70%.

3. The lighting element of claim 2, further comprising:
   a first transparent conductive layer formed at least partially adjacent to the first contact and at least partially adjacent to the first conductive element, the first transparent conductive layer configured to electrically connect the first contact and the first conductive element,
   wherein the first transparent conductive layer is sufficiently transparent to visible light such that they will not decrease light transmittance below 70%.

4. The lighting element of claim 2, wherein
   the light-emitting element is formed to be at least partially over the first conductive element.

5. The lighting element of claim 3, wherein
   no part of the light-emitting element is formed over the first conductive element.

6. The lighting element of claim 2, further comprising:
   a third conductive element located on the first flexible substrate;
   a connection element located between the second conductive element and the third conductive element, the connection element being configured to electrically connect the second conductive element to the third conductive element,
   wherein the third conductive element is at least partially transparent to a selected wavelength of light.

7. The lighting element of claim 6, wherein
   the connection element is at least partially transparent to the selected wavelength of light.

8. The lighting element of claim 1, wherein
   the flexible transparent layer is one of a second flexible substrate and a flexible hardened conformal coating.

9. The lighting element of claim 1, wherein
   the first flexible substrate is substantially transparent to the selected wavelength of light.

10. The lighting element of claim 1, wherein
the first and second conductive elements each comprise copper, copper alloy silver, silver alloy aluminum, or aluminum alloy.

11. The lighting element of claim 1, wherein
the first and second conductive elements are both buss bars.

12. A lighting element, comprising:
a first substrate;
a first conductive element located on the first substrate;
a light-emitting element having a first contact and a second contact, the first contact being on a first surface of the light-emitting diode, the second contact being on a second surface of the light-emitting element that is opposite to the first side;
a transparent layer located adjacent to the second surface of the light-emitting element;
a transparent affixing layer located between the first substrate and the transparent layer, the transparent affixing layer being configured to affix the transparent layer to the first substrate; and
a second conductive element located beneath the transparent layer and proximate to the second surface of the light-emitting element,
wherein
the first contact is electrically connected to the first conductive element,
the second contact is electrically connected to the second conductive element,
the light-emitting element is configured to emit light from the second surface with the light in wavelengths between 10 nm and 100,000 nm,
the transparent layer and the transparent affixing layer are both sufficiently transparent to visible light such that they will not decrease light transmittance below 70%,
the first and second conductive elements are 300 µm or smaller in width, the width being measured in a direction parallel to a top surface of the first substrate,
the first substrate is a flexible substrate, and
the transparent layer is a flexible transparent layer.

13. The lighting element of claim 12, further comprising:
a second transparent conductive layer formed at least partially adjacent to the second contact and at least partially adjacent to the second conductive element, the second transparent conductive layer configured to electrically connect the second contact and the second conductive element,
wherein the second transparent conductive layer is sufficiently transparent to visible light such that they will not decrease light transmittance below 70%.

14. The lighting element of claim 13, further comprising:
a first transparent conductive layer formed at least partially adjacent to the first contact and at least partially adjacent to the first conductive element, the first transparent conductive layer configured to electrically connect the first contact and the first conductive element,
wherein the first transparent conductive layer is sufficiently transparent to visible light such that they will not decrease light transmittance below 70%.

15. The lighting element of claim 14, wherein
the light-emitting element is applied to be at least partially over the first conductive element.

16. The lighting element of claim 14, wherein
no part of the light-emitting element is applied over the first conductive element.

17. The lighting element of claim 13, further comprising:
a third conductive element located on the first substrate; a connection element located between the second conductive element and the third conductive element, the connection element being configured to electrically connect the second conductive element to the third conductive element,
wherein the third conductive element is at least partially transparent to selected wavelengths between 10 nm and 100,000 nm.

18. The lighting element of claim 12, wherein the connection element is at least partially transparent to a wavelength of light between 10 nm and 100,000 nm.

19. The lighting element of claim 12, wherein
the transparent layer is one of a second substrate and a hardened conformal coating.

20. The lighting element of claim 12, wherein
the first and second conductive elements each comprise a conductive material.

21. The lighting element of claim 12, wherein
the first and second conductive elements each comprise copper, copper alloy, silver, silver alloy, aluminum, or aluminum alloy, conductive epoxy, or conductive inks.

22. The lighting element of claim 12, wherein
the first and second conductive elements are both buss bars.

23. A lighting element, comprising:
a first substrate;
a first conductive element located on the first substrate;
a light-emitting element having a first contact and a second contact, the first contact being on a first surface of the light-emitting element, the second contact being on a second surface of the light-emitting element that is opposite to the first side;
a transparent layer located adjacent to the second surface of the light-emitting element;
a transparent affixing layer located between the first substrate and the transparent layer, the transparent affixing layer being configured to affix the transparent layer to the first substrate;
a second conductive element located beneath the transparent layer and proximate to the second surface of the light-emitting element; and
an opaque design feature formed over at least one of the first conductive element and the second conductive element, the opaque design concealing at least one of the first conductive element and the second conductive element from above,
wherein
the first contact is electrically connected to the first conductive element,
the second contact is electrically connected to the second conductive element,
the light-emitting element is configured to emit light from the second surface with the light having wavelengths between 10 nm and 100,000 nm,
the transparent layer and the transparent affixing layer are both sufficiently transparent to visible light such that they will not decrease light transmittance below 70%,
the first substrate is a flexible substrate, and
the transparent layer is a flexible transparent layer.

24. The lighting element of claim 23, further comprising:
a second transparent conductive layer applied at least partially adjacent to the second contact and at least partially adjacent to the second conductive element, the second transparent conductive layer configured to electrically connect the second contact and the second conductive element,
wherein the second transparent conductive layer is sufficiently transparent to visible light such that they will not decrease light transmittance below 70%.

25. The lighting element of claim 24, further comprising:
a first transparent conductive layer formed at least partially adjacent to the first contact and at least partially adjacent to the first conductive element, the first transparent conductive layer configured to electrically connect the first contact and the first conductive element,
wherein the first transparent conductive layer is sufficiently transparent to visible light such that they will not decrease light transmittance below 70%.

26. The lighting element of claim 25, wherein
the light-emitting element is formed to be at least partially over the first conductive element.

27. The lighting element of claim 25, wherein
no part of the light-emitting element is formed over the first conductive element.

28. The lighting element of claim 24, further comprising:
a third conductive element located on the first substrate;
a connection element located between the second conductive element and the third conductive element, the connection element being configured to electrically connect the second conductive element to the third conductive element,
wherein the third conductive element is at least partially transparent to wavelengths between 10 nm and 100,000 nm.

29. The lighting element of claim 28, wherein the connection element is at least partially transparent to the wavelengths between 10 nm and 100,000 nm.

30. The lighting element of claim 23, wherein
the transparent layer is one of a second substrate and a hardened conformal coating.

31. The lighting element of claim 23, wherein the opaque design feature comprises:
a first opaque design feature formed over the first conductive element, the first opaque design completely concealing the first conductive element from above; and
a second opaque design feature formed over the second conductive element, the second opaque design completely concealing the second conductive element from above.

32. The lighting element of claim 23, wherein
the first and second conductive elements are both buss bars.

33. The lighting element of claim 23, wherein the opaque design feature is an ornamental decoration, a frame, a filter, or a mask.

* * * * *